(12) United States Patent
Arashima et al.

(10) Patent No.: US 10,816,579 B2
(45) Date of Patent: Oct. 27, 2020

(54) SENSOR, SENSOR SIGNAL PROCESSOR, AND POWER LINE SIGNAL ENCODER

(71) Applicant: INFORMETIS CORPORATION, Tokyo (JP)

(72) Inventors: Kenji Arashima, Tokyo (JP); Takashi Shibuya, Tokyo (JP); Mototsugu Abe, Tokyo (JP); Masayuki Nishiguchi, Tokyo (JP)

(73) Assignee: Informetis Corporation, Tokyo (JP)

( * ) Notice: Subject to any disclaimer, the term of this patent is extended or adjusted under 35 U.S.C. 154(b) by 1470 days.

(21) Appl. No.: 14/385,000

(22) PCT Filed: Feb. 14, 2013

(86) PCT No.: PCT/JP2013/054244
§ 371 (c)(1),
(2) Date: Jul. 27, 2015

(87) PCT Pub. No.: WO2013/136935
PCT Pub. Date: Sep. 19, 2013

(65) Prior Publication Data
US 2015/0331025 A1    Nov. 19, 2015

(30) Foreign Application Priority Data

Mar. 13, 2012   (JP) .................................. 2012-055492
Jan. 15, 2013   (JP) .................................. 2013-004345

(51) Int. Cl.
*G01R 22/06*   (2006.01)
*G01R 21/06*   (2006.01)
(Continued)

(52) U.S. Cl.
CPC ......... *G01R 22/063* (2013.01); *G01R 15/142* (2013.01); *G01R 15/18* (2013.01);
(Continued)

(58) Field of Classification Search
None
See application file for complete search history.

(56) References Cited

U.S. PATENT DOCUMENTS 4,799,005 A * 1/1989 Fernandes .............. G01K 1/024
                                                 324/117 R
6,462,519 B1  10/2002 McDaniel
(Continued)

FOREIGN PATENT DOCUMENTS

JP    56-058465    5/1981
JP    2001-198091  7/2001
(Continued)

OTHER PUBLICATIONS

Search Report received in EP 13761724.7, dated Dec. 15, 2015 (6 pages).
(Continued)

*Primary Examiner* — Gregory J Toatley, Jr.
*Assistant Examiner* — Terence E Stifter, Jr.
(74) *Attorney, Agent, or Firm* — K&L Gates LLP

(57) ABSTRACT

Provided is a sensor in which a current sensor that detects a current of a power line as a change in a magnetic field and a voltage sensor that detects a voltage of the power line using capacitive coupling are integrally formed. The transmission of signals related to substantially the same sections is omitted in order to effectively compress an output signal from the sensor and an output signal from the voltage sensor. When the amplitude and phase of a fundamental wave which are estimated from the output signal from the sensor and the amplitude and phase of harmonics are encoded, the amplitude and phase of the harmonics are relativized with a value for the fundamental wave.

5 Claims, 24 Drawing Sheets

(51) Int. Cl.
*G01R 22/10* (2006.01)
*G01R 15/18* (2006.01)
*G01R 15/14* (2006.01)
*G01R 21/133* (2006.01)
*G01R 19/25* (2006.01)

(52) U.S. Cl.
CPC .......... *G01R 21/06* (2013.01); *G01R 22/068* (2013.01); *G01R 22/10* (2013.01); *G01R 19/2513* (2013.01); *G01R 21/133* (2013.01)

(56) References Cited

U.S. PATENT DOCUMENTS

| | | | |
|---|---|---|---|
| 6,555,997 B1 | 4/2003 | De Vries | |
| 7,174,260 B2* | 2/2007 | Tuff | G06Q 50/06 |
| | | | 702/61 |
| 7,415,370 B2* | 8/2008 | Nisenblat | G01R 13/0209 |
| | | | 702/66 |
| 7,622,915 B2 | 11/2009 | Adams | |
| 2005/0060107 A1* | 3/2005 | Rodenberg, III | G01D 4/006 |
| | | | 702/62 |
| 2007/0179718 A1* | 8/2007 | Hyacinthe | G01R 19/2513 |
| | | | 702/57 |
| 2009/0256580 A1 | 10/2009 | Heckleman et al. | |
| 2011/0112779 A1* | 5/2011 | Tse | G01R 19/2513 |
| | | | 702/60 |
| 2011/0144932 A1* | 6/2011 | Alles | G01D 4/002 |
| | | | 702/61 |
| 2012/0046799 A1* | 2/2012 | Alex | G01R 15/142 |
| | | | 700/298 |

FOREIGN PATENT DOCUMENTS

| | | |
|---|---|---|
| JP | 2006-084176 | 3/2006 |
| JP | 2009-282017 | 12/2009 |
| JP | 2010-249525 | 11/2010 |
| JP | 2011-027679 A | 2/2011 |
| JP | 2011-155445 | 8/2011 |

OTHER PUBLICATIONS

International Search Report issued in connection with International Patent Application No. PCT/JP2013/054244, dated Jun. 4, 2013. (3 pages).

Japanese Office Action (with English translation) dated Aug. 9, 2016 in corresponding Japanese application No. 2014-504753 (9 pages).

Remscrim et all., FPGA-Based Spectral Envelope Preprocessor for Power Monitoring and Control, Applied Power Electronics Conference and Exposition, 2010 Twenty-Fifth Annual IEEE, Feb. 21, 2010, pp. 2194-2201.

European Office Action dated Dec. 15, 2016 in corresponding European application No. 13761724.7 (7 pages).

* cited by examiner

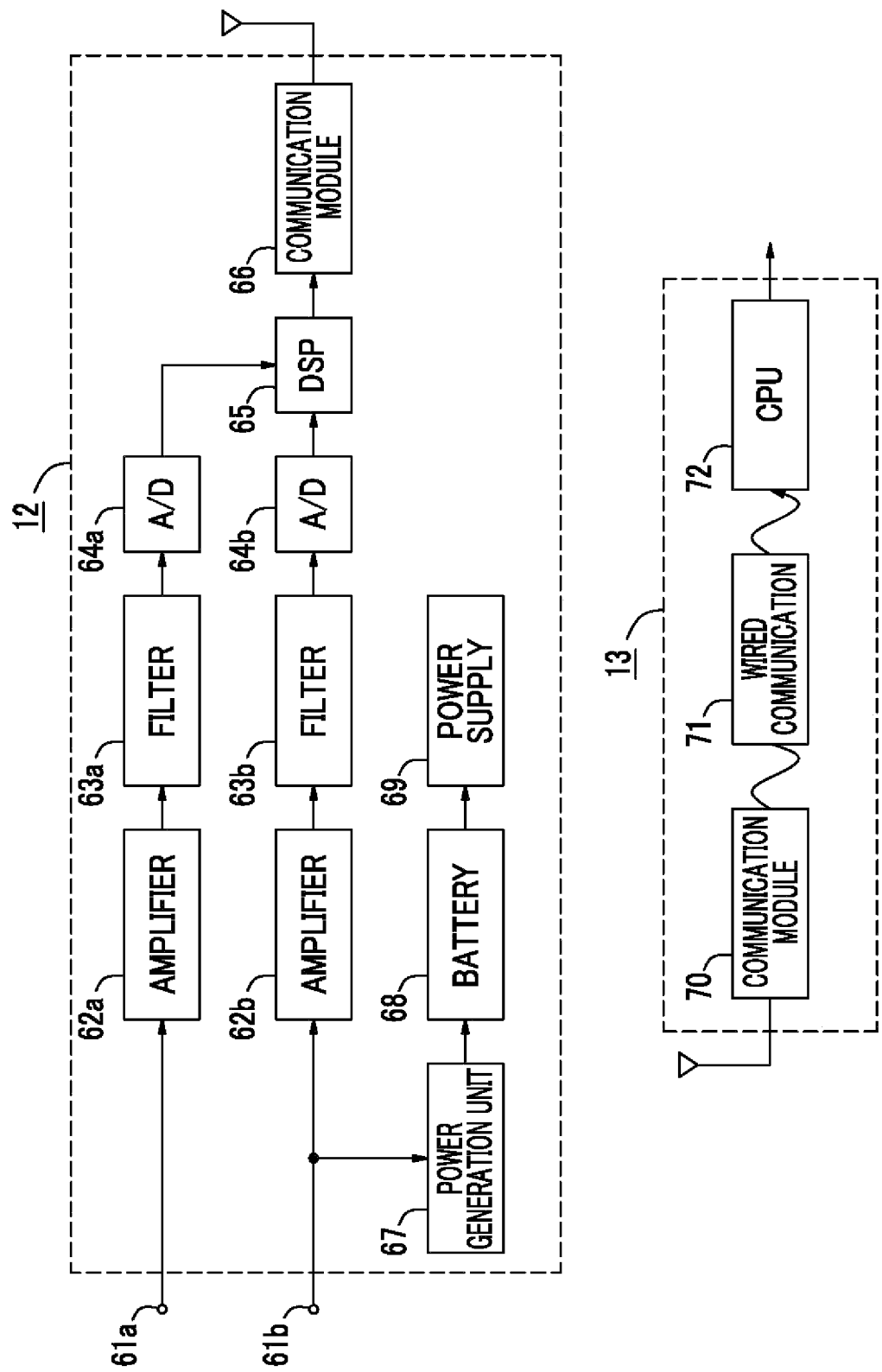

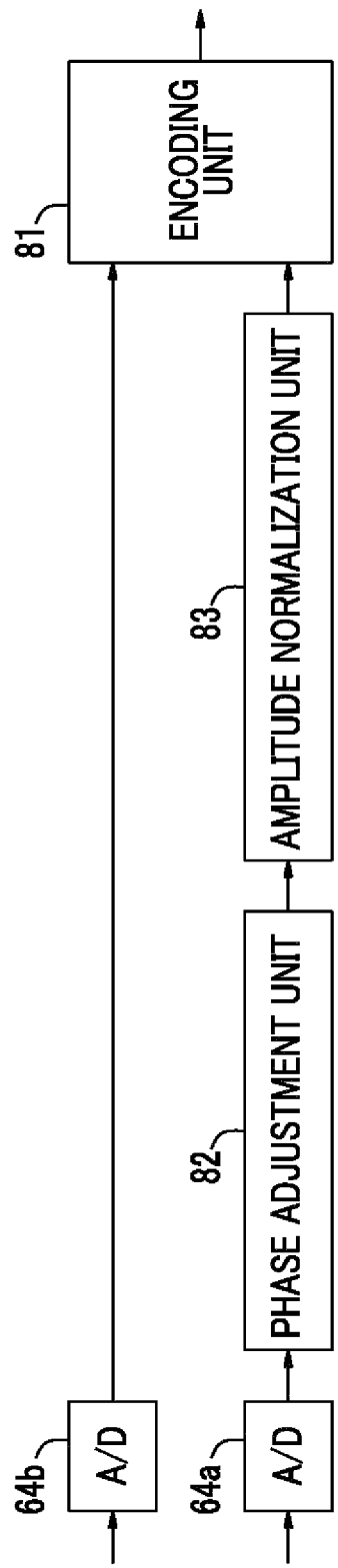

FIG. 24

$y[r,m]$ $w_y[m]$ $y_w[r,m]$ $y_w[r,n-rR]$ $z[n]$ OBTAINED BY CONNECTING UP TO $(r-1)$-TH FRAME $z[n]$ OBTAINED BY CONNECTING UP TO $r$-TH FRAME

SENSOR, SENSOR SIGNAL PROCESSOR, AND POWER LINE SIGNAL ENCODER

TECHNICAL FIELD

The present disclosure relates to a sensor, a sensor signal processor, and a power line signal encoder which can measure the current and voltage of a power line in a non-contact manner.

BACKGROUND ART

A technique has been considered which monitors power consumption in a house, visualizes the power consumption, saves energy, controls electric appliances, diagnoses the state of the electric appliances, and monitors the behavior (living conditions) of a person in a building. For example, in a system disclosed in PTL 1, a power waveform of a power socket is detected and characteristic data is formed from the detected power waveform and is transmitted to a server. The server determines the type and operation content of the electric appliances from the characteristic data with reference to a database and stores the determination result as the behavior information of the user.

As such, it is necessary to attach measurement devices corresponding to the number of electric appliances in order to determine the type and state of electric appliances connected to a power line. As a result, costs for measurement equipment and installation costs increase. In addition, in the measurement of the current or voltage waveform of each electric appliance, when all waveform data is transmitted, the amount of data and power consumed for transmission increase. In particular, when data is wirelessly transmitted, it is difficult to constantly transmit all of the data since a band is limited.

CITATION LIST

Patent Literature

[PTL 1] JP-A-2011-155445

SUMMARY OF INVENTION

Technical Problem

In recent years, for example, a system has been proposed in which a sensor is attached to a home distribution panel and the waveforms of the voltage and current that flows in the entire house are analyzed to estimate the usage state and power consumption of electric appliances in the house. In the system, a sensor and a signal processing unit do not need to be attached to each electric appliance or each power socket and it is possible to construct the system with a low cost. An apparatus has been known in which a sensor is attached to a distribution panel and measures only the amount of power consumed. However, when the usage state of the electric appliances is estimated, only the power consumption is insufficient to estimate the usage state and it is necessary to detect the waveforms of the voltage and current with high accuracy.

A clamp-type AC current sensor has been known as a device which measures a current that flows through a power line in a non-contact manner. However, in order to detect the voltage waveform of the power line, it is necessary to branch the power line and add a power outlet. This work is dangerous because of an electric shock and only qualified electric engineers should perform the work. As a result, the costs of voltage measurement increase and taking a voltage measurement is troublesome.

Therefore, an object of the present disclosure is to provide a sensor, a sensor signal processor, and a power line signal encoder which can measure the current and voltage with high accuracy in a non-contact manner.

Solution to Problem

In order to solve the above-mentioned problems, the present disclosure provides a sensor in which a current sensor that detects a current of a power line as a change in a magnetic field and a voltage sensor that detects a voltage of the power line using capacitive coupling are integrally formed.

The present disclosure provides a sensor signal processor that receives a measurement signal from a sensor in which a current sensor detecting a current of a power line as a change in a magnetic field and a voltage sensor detecting a voltage of the power line using capacitive coupling are integrally formed. The sensor signal processor includes a phase correction unit that corrects a phase of the measurement signal of the voltage sensor in correspondence with a frequency of the voltage such that a phase of the measurement signal is substantially identical to a phase of the voltage of the power line.

The present disclosure provides a power line signal encoder that receives a power line signal, divides the power line signal into preset sections, determines whether the divided power line signals are identical to each other, omits the transmission of a first divided power line signal when the first divided power line signal is substantially identical to a second divided power line signal which precedes the first divided power line signal in terms of time, transmits the first divided power line signal when the first divided power line signal is not substantially identical to the second divided power line signal, and encodes the first divided power line signal to be transmitted.

The present disclosure provides a power line signal encoder including an estimation unit that estimates a first amplitude and a first phase of a fundamental wave with a current waveform and/or a voltage waveform in a predetermined section and a second amplitude and a second phase of a harmonic, a relativization unit that relativizes the second amplitude with the first amplitude and relativizes the second phase with the first phase, and a quantization unit that quantizes the first amplitude and the first phase and the relativized second amplitude and second phase.

Advantageous Effects of Invention

The present disclosure can measure the voltage waveform of a power line with high accuracy in a non-contact manner and determine the usage state of home electric appliances.

BRIEF DESCRIPTION OF DRAWINGS

FIG. 10 is a block diagram illustrating an example of a sensor signal processing circuit.

FIG. 11 is a block diagram illustrating the sensor signal processing circuit in detail.

FIG. 24 is a waveform diagram illustrating the process of a waveform composition unit in the process of a decoder corresponding to another example of the power information encoder.

DESCRIPTION OF EMBODIMENTS

The following embodiments are preferred embodiments of the present disclosure and have technically preferable various limitations given thereto. However, the scope of the present disclosure is not limited to these embodiments as long as there is no description that particularly limits the present disclosure in the following explanation.

The following description is made in the following order.
<1. Basic System>
<2. Sensor>
<3. Sensor Signal Processing Circuit>
<4. Example of Encoding/Decoding>
<5. Another Example of Encoding/Decoding>
<6. Modification Examples>

1. Basic System

Figure 1:
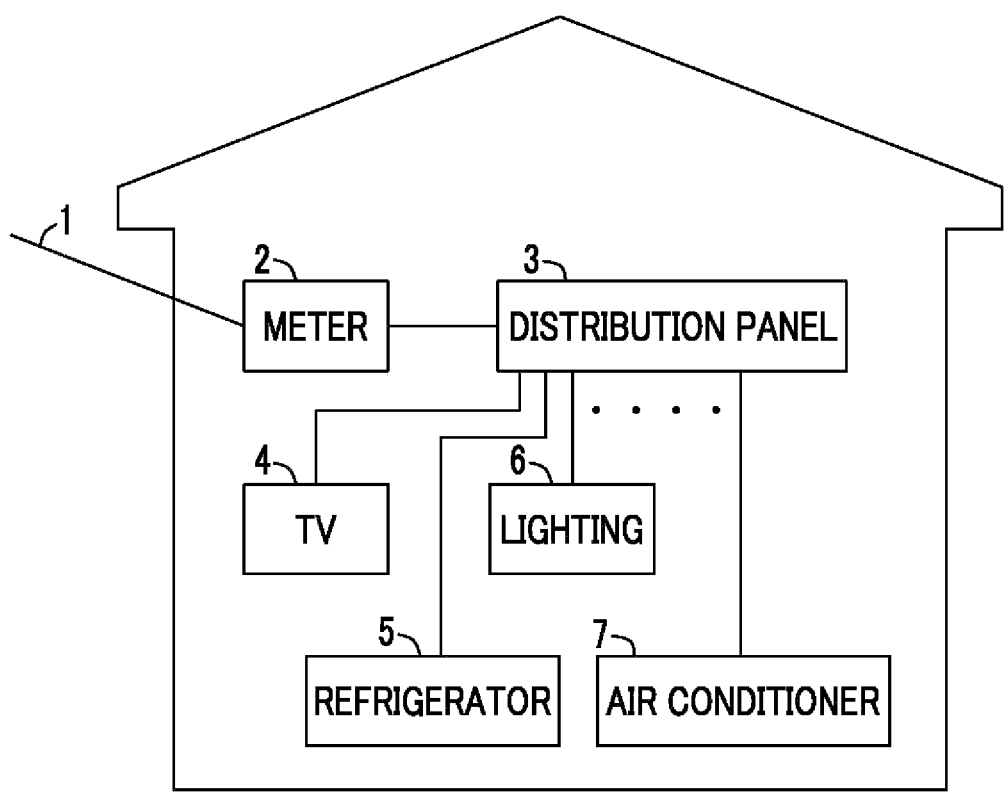
FIG. 1 is a schematic diagram illustrating an example of a home power system to which the present disclosure can be applied.

An example of a power system, for example, a home power system to which the present disclosure can be applied will be described with reference to FIG. 1. A power line is introduced from an outdoor distribution line into a building through a leading wire 1 and is connected to a power meter 2. A distribution panel 3 is connected to the output side of the power meter 2. Electric appliances (for example, a television set 4, a refrigerator 5, lighting equipment 6, and an air conditioner 7) are connected to indoor power lines extending from the distribution panel 3.

Figure 2:
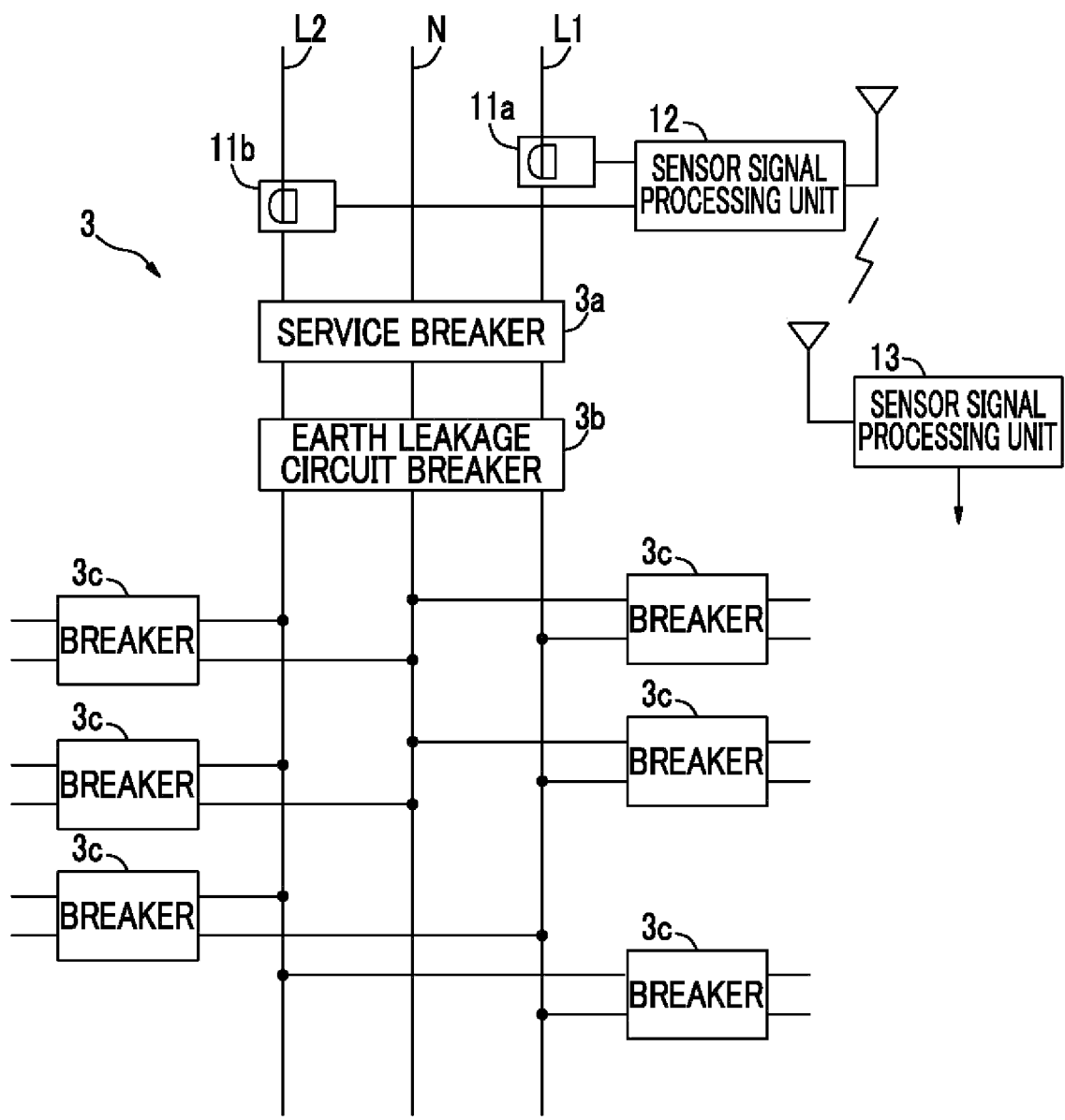
FIG. 2 is a block diagram illustrating the attachment of a sensor according to the present disclosure.

A current and voltage measurement device according to the present disclosure is attached in the power meter 2 or to power lines in the vicinity of wiring lines of the distribution panel 3. As shown in FIG. 2, the current and voltage measurement device is connected to the power lines in front of the distribution panel 3. In the case of a general house, a single-phase three-wire system including three electric wires, that is, a neutral line N, which is a center line, and voltage lines L1 and L2 is used. The neutral line N and the voltage line L1 or L2 are used to use a voltage of 100 V. The voltage lines L1 and L2 are used to use a voltage of 200 V. In addition, the present disclosure can be applied to a two-wire system.

In Japan, the distribution panel 3 includes a service breaker 3a, an earth leakage circuit breaker 3b, and safety breakers 3c from the lead-in side. The service breaker 3a automatically cuts the supply of a current when a current that is equal to or greater than a current contract of an electric power company flows. The earth leakage circuit breaker 3b detects a leakage current from indoor wires or electric appliances and automatically cuts the supply of the current. The safety breaker 3c is attached to each branch circuit which transmits electricity from the distribution panel 3 to each room. When a short circuit occurs due to a failure in the electric appliances or wires and an overcurrent flows, the safety breaker 3c automatically cuts the supply of the current.

A sensor 11a is attached in order to measure the current and voltage of the voltage line L1 in front of the distribution panel 3 in a non-contact manner and a sensor 11b is attached in order to measure the current and voltage of the voltage line L2 in a non-contact manner. Measurement signals of the voltage and current detected by the sensors 11a and 11b (hereinafter, simply referred to as a sensor 11 when two sensors do not need to be distinguished from each other) are supplied to a sensor signal processing unit 12. The sensor signal processing unit 12 processes the output signal from the sensor 11 and wirelessly transmits the measurement data using a communication unit. The sensor signal processing unit may be provided for each sensor.

A sensor signal processing unit 13 receives the measurement data transmitted from the sensor signal processing unit 12. The sensor signal processing unit 13 decodes the measurement data from the received data. The communication method is not limited to wireless communication, but wired communication, such as power line communication (PLC), may be used. For example, a display device (not shown) is connected to the sensor signal processing unit 13. The sensor signal processing unit 13 is provided in, for example, a home gateway. Processing may not be completed in the house. For example, the sensor signal processing unit 13 may be implemented by a server (cloud) on a network.

Although not shown in the drawings, for example, a display unit and a control unit are connected to the sensor signal processing unit 13. The display unit displays, for example, the current usage state of power and the current usage state of each electric appliance to achieve so-called power visualization. The control unit stores, for example, the history of the usage state of each electric appliance and presents, for example, measures to reduce power consumption to the user.

2. Sensor

"Clamp-Type AC Current Sensor"

Figure 3:
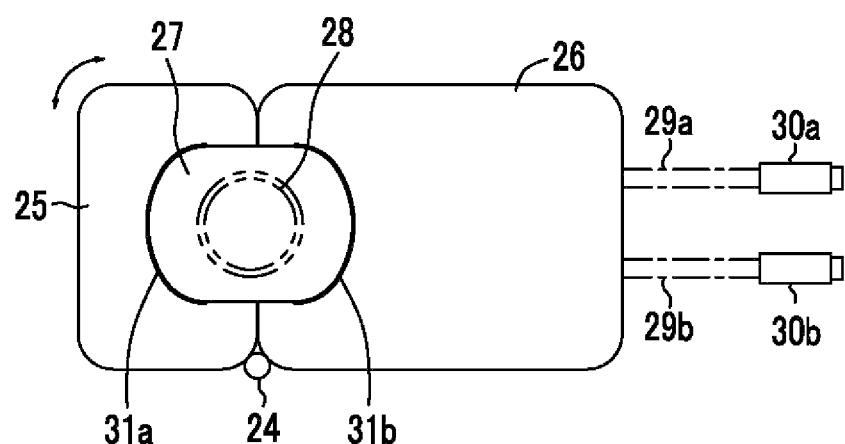
FIG. 3 is a front view illustrating an example of the sensor according to the present disclosure.
Figure 4:
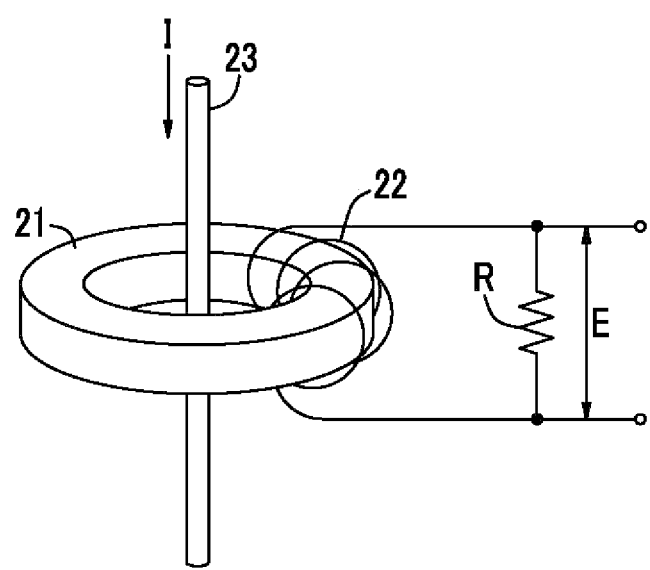
FIG. 4 is a schematic diagram illustrating the principle of CT.

As shown in FIG. 3, a clamp-type AC current sensor, which is a kind of current transformer (CT), can be used as the sensor 11. FIG. 4 shows the principle of the CT. A secondary winding 22 is wound with n turns on a ring core 21. A power line 23 passes through a hole which is provided at the center of the ring core 21. The power line 23 is a primary winding and the ratio of current transformation is 1:n. A resistor R is connected to both ends of the secondary winding 22 and an output current which is generated when a current I flows to the power line 23 is converted into a voltage E.

In the case of the clamp-type AC current sensor, as shown in FIG. 3, a movable portion 25 is pivotable about a rotating shaft 24 with respect to a fixed portion 26 and a power line 28 passes through a central clamping hole 27. For example, two ring cores 21 shown in FIG. 4 are separately provided in the housing of the movable portion 25 and the fixed portion 26. When the movable portion 25 is closed, the end surfaces of the movable portion 25 and the fixed portion 26 are connected to each other to form the ring core. The power line 28 is the voltage line L1 or L2.

A current signal and a voltage signal are output from the fixed portion 26 of the sensor 11 to audio jacks 30a and 30b through two audio cables 29a and 29b, respectively. Similarly to a stereo audio signal, the audio jacks 30a and 30b can be distinguished by colors (for example, red and white). Audio plugs (not shown) are detachably connected to the audio jacks 30a and 30b. The audio jacks 30a and 30b may be a standard type or a miniature type. Furthermore, in addition to the jacks and the plugs, audio connectors may be used.

That is, voltage and current information may be treated as audio data and the same encoding method as that used for the audio data may be used. In this case, the following advantages are obtained.

A sampling rate increases and it is possible to obtain the waveform information of the current and voltage with high accuracy.

As a result, it is possible to check, for example, the usage state of the electric appliances from the waveform information of the current and voltage.

Since the existing audio data compression techniques can be used, development costs can be reduced. In addition, it is possible to reduce the amount of measurement data and to narrow a transmission bandwidth using compression.

Since an audio data compression circuit has low power consumption, it is advantageous to form an operating power by using the measurement result.

Voltage data and current data of the measurement data correspond to the left and right channels of the stereo audio signal, which makes it easy to compress the measurement data using the audio signal data compression technique. The band of the measurement data is equal to the band of the audio signal. In addition, the same interface as an audio interface is provided, which makes it easy to form the sensor signal processing unit 12 using a mobile apparatus including the audio interface.

The movable portion 25 is pivoted about the rotating shaft 24 such that the power line 28 passes through the clamping hole 27. It is possible to extract an output current which is induced by the current that flows through the power line 28. As described above, the output current is converted into, for example, an output voltage and the output voltage is output to one audio jack, for example, the jack 30a.

"Voltage Sensor"

A voltage sensor is formed integrally with the clamp-type AC current sensor. The voltage sensor measures the voltage of the power line 28 in a non-contact manner using capacitive coupling. For example, an electrode is contacted with an insulating coating of the power line 28 and a capacitor is formed by the electrode, an insulator, and another electrode. A voltage is induced by electrostatic coupling with the capacitor and is extracted. Therefore, it is possible to measure the voltage of the core of the power line 28, for example, a voltage waveform.

In the example shown in FIG. 3, a pair of electrodes 31a and 31b (hereinafter, simply referred to as electrodes when two electrodes do not need to be particularly distinguished from each other) are provided on the inner circumferential surface of the ring core having the clamping hole 27 provided therein. As in the electrodes 31a and 31b, the electrode forms a portion of the arc. However, the shape of the electrode is not limited thereto, but the electrode may have a continuous O-shape or a C-shape obtained by cutting a portion of an O-shape.

Figure 5:
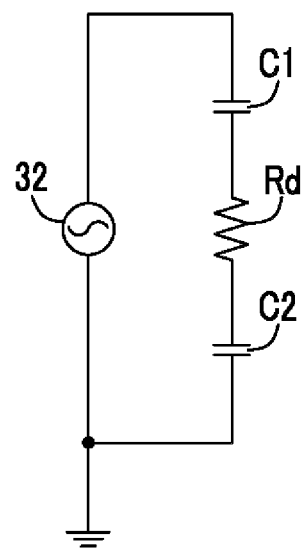
FIG. 5 is a connection diagram illustrating an equivalent circuit of a voltage sensor using capacitive coupling.

When the power line 28 which passes through a substantially central position of the clamping hole 27 is in a live state, the voltage which is induced by capacitive coupling can be detected by the electrodes 31. The voltage sensor can be represented by the equivalent circuit shown in FIG. 5. An AC power supply 32 corresponds to the voltage of the power line 28. A resistor Rd is a resistive component of the sensor 11. A capacitor C1 is a capacitor formed between the power line 28 and the electrode 31a and a capacitor C2 is a capacitor formed between the power line 28 and the electrode 31b.

When the distance between the core (conductor) of the power line 28 and the electrode 31 is d, the permittivity of an insulator between the core and the electrode 31 is e, and an area parallel to the core and the electrode 31 is A, the capacitance values C of the capacitors C1 and C2 are represented as follows:

$$C = \varepsilon A/d.$$

Figure 6:
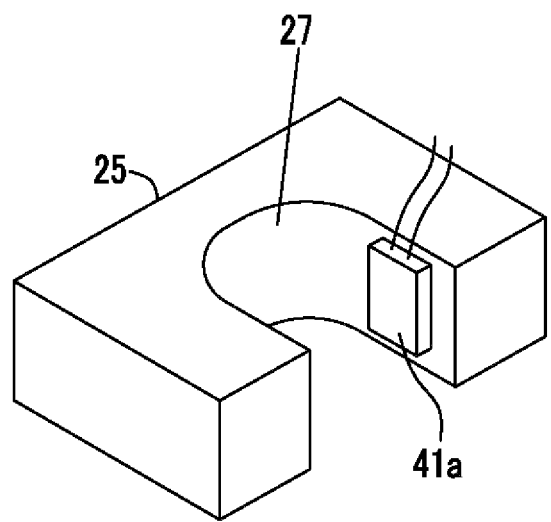
FIG. 6 is a schematic perspective view illustrating an example of the voltage sensor using capacitive coupling.

In addition, as schematically shown in FIG. 6, as the capacitive coupling voltage sensor, plate-shaped electrodes 41a and 41b (hereinafter, simply referred to as electrodes 41 when two electrodes do not need to be particularly distinguished from each other) may be provided on the inner surface of the ring core of the movable portion 25 (or the fixed portion 26) so as to face each other, with the clamping hole 27 interposed therebetween. The electrode 41 is provided in a planar portion in the vicinity of a division position of the ring core.

Figure 7:
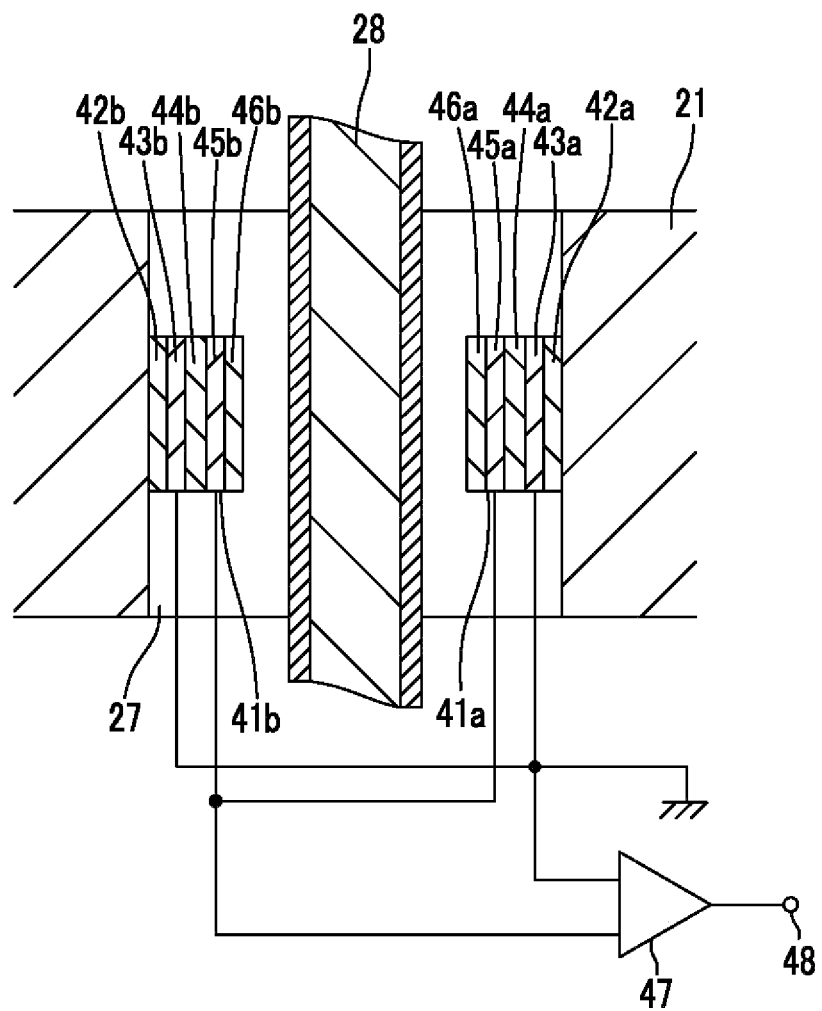
FIG. 7 is a schematic diagram used to illustrate the connection relationship of an example of the voltage sensor.

FIG. 7 is an enlarged cross-sectional view illustrating a portion of FIG. 6. The electrodes 41a and 41b are provided on the inner surface of the ring core 21 so as to face each other, with the clamping hole 27 interposed therebetween. The electrode 41a and the electrode 41b are arranged in parallel so as to be symmetric with respect to the center of the power line 28 and the electrode 41 and the insulating coating of the power line 28 are close to each other or come into contact with each other. Each of the electrodes 41a and 41b has a laminated structure of five layers. That is, an insulating layer 42a or 42b, an electrode 43a or 43b, an insulating layer 44a or 44b, an electrode 45a or 45b, and an insulating layer 46a or 46b are sequentially laminated from the inner surface of the ring core 21.

A differential amplifier 47 is provided in order to extract an output signal from the voltage sensor. The electrodes 43a and 43b and one input terminal of the differential amplifier 47 are grounded. The electrodes 45a and 45b are connected to the other input terminal of the differential amplifier 47. A voltage measurement signal of the voltage sensor is extracted from an output terminal 48 of the differential amplifier 47.

Figure 8A:
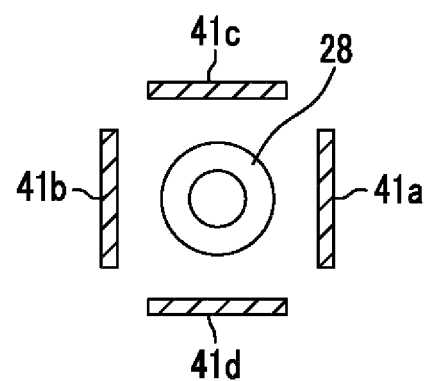
FIGS. 8A to 8C are schematic diagrams used to illustrate modification examples of the voltage sensor.
Figure 8B:
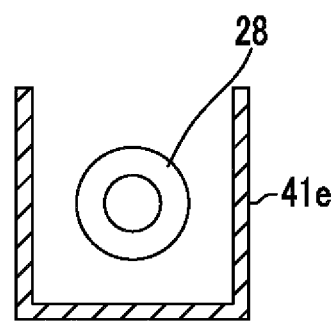
Figure 8C:
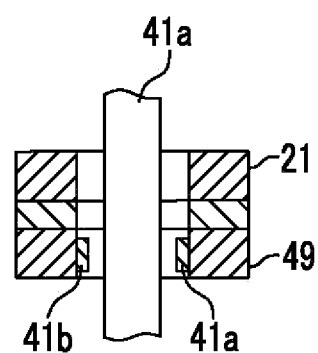

FIG. 8 shows another example of the arrangement of the electrodes of the capacitive coupling voltage sensor. As shown in FIG. 8A, in addition to the electrodes 41a and 41b which are provided so as to face each other as described above, electrodes 41c and 41d may be provided at positions that are rotated 90° from the positions of the electrodes 41a and 41b. As shown in FIG. 8B, an electrode 41e which has a U-shape in a cross-sectional view may be used. As shown in FIG. 8C, a ring-shaped support 49 which has the same shape as the ring core 21 may be laminated on the ring core 21 and the electrodes 41a and 41b may be attached to the ring-shaped support 49 so as to face each other, with a hole of the ring-shaped support 49 interposed therebetween. The ring core 21 and the ring-shaped support 49 are integrated with each other by a connection member.

Figure 9A:
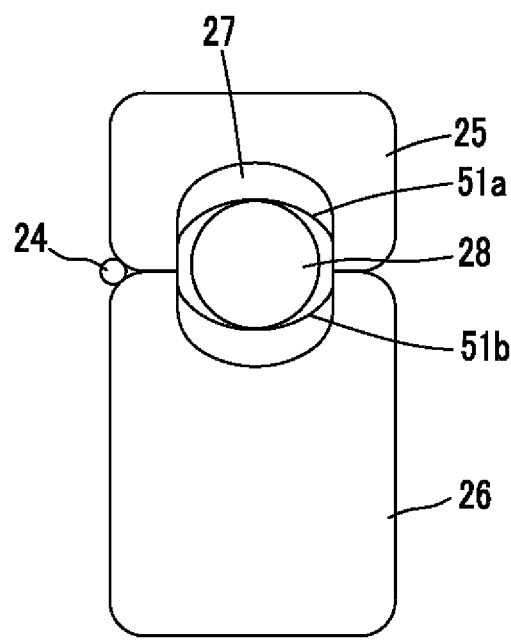
FIG. 9A is a front view illustrating a current sensor and FIG. 9B is a front view illustrating another example of the current and voltage sensors.
Figure 9B:
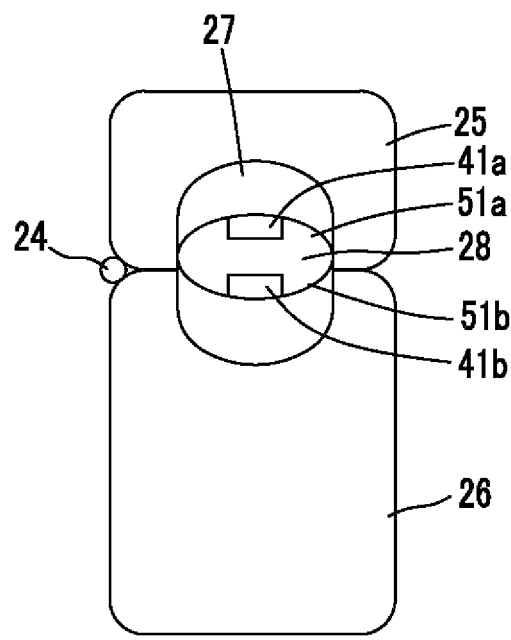

FIG. 9A shows a clamp-type AC current sensor in which the power line 28 is interposed between pressing members 51a and 51b during measurement and a power line 29 is fixed. In this type of sensor, as shown in FIG. 9B, the electrodes 41a and 41b are provided at the opposite positions of the pressing members 51a and 51b.

3. Sensor Signal Processing Unit

"Sensor Signal Processing Unit 12"

FIG. 10 shows an example of the sensor signal processing units 12 and 13. The voltage measurement signal output from the capacitive coupling voltage sensor is input to an input terminal 61a and a current measurement signal output from the clamp-type AC current sensor is input to an input terminal 61b. The voltage measurement signal is supplied to an A/D converter 64a through an amplifier 62a and a filter 63a and is converted into a digital signal. The filter 63a removes unnecessary signal components.

Similarly to the voltage measurement signal, the current measurement signal output from the sensor is supplied to an A/D converter 64b through an amplifier 62b and a filter 63b and is converted into a digital signal. The digital signals from the A/D converters 64a and 64b are supplied to a digital signal processor (DSP) 65. In addition, the amplifiers 62a and 62b and the filters 63a and 63b may be provided in the sensors.

The DSP 65 performs amplitude normalization and phase adjustment on the measurement data, which will be described below. In addition, the DSP 65 encodes digital voltage measurement data and digital current measurement data. The same encoding method as that used for audio data can be used as the encoding. The encoding is compressing the amount of transmission data.

The compression-encoded measurement data from the DSP 65 is supplied to a communication module 66. An output signal from the communication module 66 is wirelessly transmitted. As the communication system, there is a method which uses a sensor network based on a wireless communication standard, such as Bluetooth (registered trademark), ZigBee, or Wi-Fi. The Bluetooth (registered trademark) system is applied to multi-media communication and can perform one-to-many communication. ZigBee uses a physical layer of Institute of Electrical and Electronics Engineers (IEEE) 802.15.4. IEEE 802.15.4 is the name of a short-distance wireless network standard which is called a personal area network (PAN) or a wireless personal area network (WPAN).

Furthermore, a serial interface, such as a universal asynchronous receiver-transceiver (UART), may be used in addition to the wireless system. Specifically, for example, a system management (SM) bus, a controller area network (CAN), and a serial peripheral interface (SPI) can be used as the serial interface.

A measurement signal is used to generate power. For example, a current measurement signal is supplied to a power generation unit 67 and DC power is generated by, for example, rectification and stabilization. A battery 68 is charged by the DC power. A stable DC power supply 69 is formed by the battery 68. The DC power supply 69 is used as an operation power supply for each circuit. A capacitor may be used together with the battery 68 or instead of the battery 68 and may be charged by the current measurement signal. Similarly to the above, the structure which generates power from the measurement signal is provided in the sensor. Since the power consumption of the sensor is less than that of the sensor signal processing unit 12, the battery may not be provided and power may be supplied only by the capacitor.

"Sensor Signal Processing Unit 13"

The sensor signal processing unit 13 includes a communication module 70 which receives radio signals from the sensor signal processing unit 12. The communication module 70 supplies the received measurement data to a central processing unit (CPU) 72 through wired communication 71, if necessary. The CPU 72 forms a microcomputer together with, for example, a random access memory (RAM) and a read only memory (ROM) which are not shown.

The CPU 72 decodes the data encoded by the DSP 65. In addition, the CPU 72 determines the type, state, and power consumption of the electric appliances which are operating from the measurement voltage signal and the measurement current signal and outputs the determination result. For example, the CPU 72 can identify the type or state of the electric appliances on the basis of the power consumption of the electric appliances connected to the power lines or a change in the current and voltage when the electric appliances start, end, and are in a normal state.

For example, a display device (not shown) for displaying the determination result is connected to the CPU 72. The sensor signal processing unit 13 may be connected to an external server through, for example, the Internet. For example, home power consumption information, information about the monitoring result of the behavior of the user, and information about the usage state of the electric appliances are transmitted to the server.

The sensor signal processing unit 13 may be provided in home electric appliances with a communication function, for example, a television set, in addition to the home gateway. A display function of the television set can be used to display information such as power consumption.

In the present disclosure, the sensor signal processing unit 13 which performs, for example, a process of decoding and analyzing the sensor signal is not necessarily installed in a house, but a server having the functions of the sensor signal processing unit 13 may be installed on the network, such as the Internet. As such, when the measurement data is transmitted to the external server, mobile apparatuses, such as a mobile phone, a smart phone, and a personal digital assistant (PDA), can have the functions of the sensor signal processing unit 12 and the communication functions of the mobile apparatuses can be used. In general, since the mobile apparatus includes the audio interface, it is possible to easily connect the sensors and the mobile apparatus (sensor signal processing unit 12).

"Phase Adjustment and Amplitude Normalization"

The amplitude normalization and phase adjustment of the measurement data by the DSP 65 of the sensor signal processing unit 12 will be described with reference to FIGS. 11 and 12. The A/D converter 64a outputs the voltage measurement data corresponding to the measurement signal of the voltage sensor using capacitive coupling. The A/D converter 64b outputs the current measurement data corresponding to the measurement signal of the clamp-type AC current sensor. The current measurement data is input to an encoding unit 81. The encoding unit 81 encodes the current data and the voltage data using the same compression coding method as that for audio data.

In the present disclosure, the voltage of the power line is measured using capacitive coupling. Therefore, in principle, there is a phase difference of 90° between the voltage waveform of the power line and the measured waveform. This phase difference is not constant at 90°, but varies depending on the frequency of an AC signal. For example, as shown in FIG. 12, the phase difference varies depending on the frequency. For example, in Japan, the AC power frequency is different in eastern Japan (50 Hz) and western Japan (60 Hz). Therefore, the phase of the voltage waveform varies a little depending on a difference in frequency.

Figure 12:
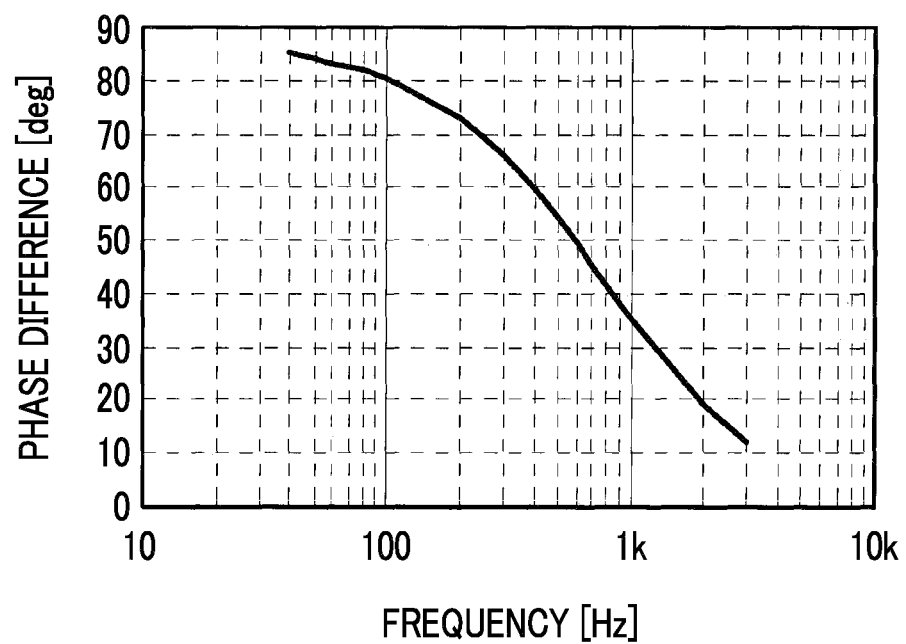
FIG. 12 is a graph illustrating a change in phase difference with respect to a change in the frequency of the voltage sensor.

The gradient of a frequency-phase difference curve shown in FIG. 12 varies depending on the structure of the voltage sensor. The variation in the gradient depending on the structure of the voltage sensor is represented by a sensor coefficient. A phase adjustment unit 82 corrects a phase variation due to capacitive coupling, a phase variation depending on the frequency, and a phase variation depending on the structure of the sensor. That is, the phase adjustment unit 82 corrects the phase of the measured voltage waveform on the basis of an AC voltage frequency and the sensor coefficient (the voltage phase of the core=the phase of the current waveform). The phase of the measurement data from the phase adjustment unit 82 is identical to the phase of the voltage waveform on the power line.

The voltage of a commercial power supply is changed in the range of (±6 V) from, for example, 101 V. Therefore, a voltage variation may be negligible. However, it is necessary to consider a variation in the amplitude of the voltage in order to accurately calculate power consumption. An amplitude normalization unit 83 normalizes a voltage variation to generate voltage measurement data with a value close to the actual amplitude of the voltage.

As a normalization method, some methods can be used. A first method uses an average voltage for a predetermined period as the amplitude. A second method uses, as the amplitude, a voltage when a current has a minimum value. In addition to these methods, the maximum amplitude and minimum amplitude of the voltage may be used or a change in the current value may be investigated to normalize the amplitude. The output of the amplitude normalization unit 83 is supplied to the encoding unit 81 and is compressed by the same encoding method as that for audio data.

The phase adjustment unit 82 and the amplitude normalization unit 83 are formed as circuits (hardware) in FIG. 11. However, the invention is not limited thereto. The phase adjustment unit 82 and the amplitude normalization unit 83 may be implemented by the software processing of the microcomputer.

4. Example of Encoding/Decoding

Figure 13:
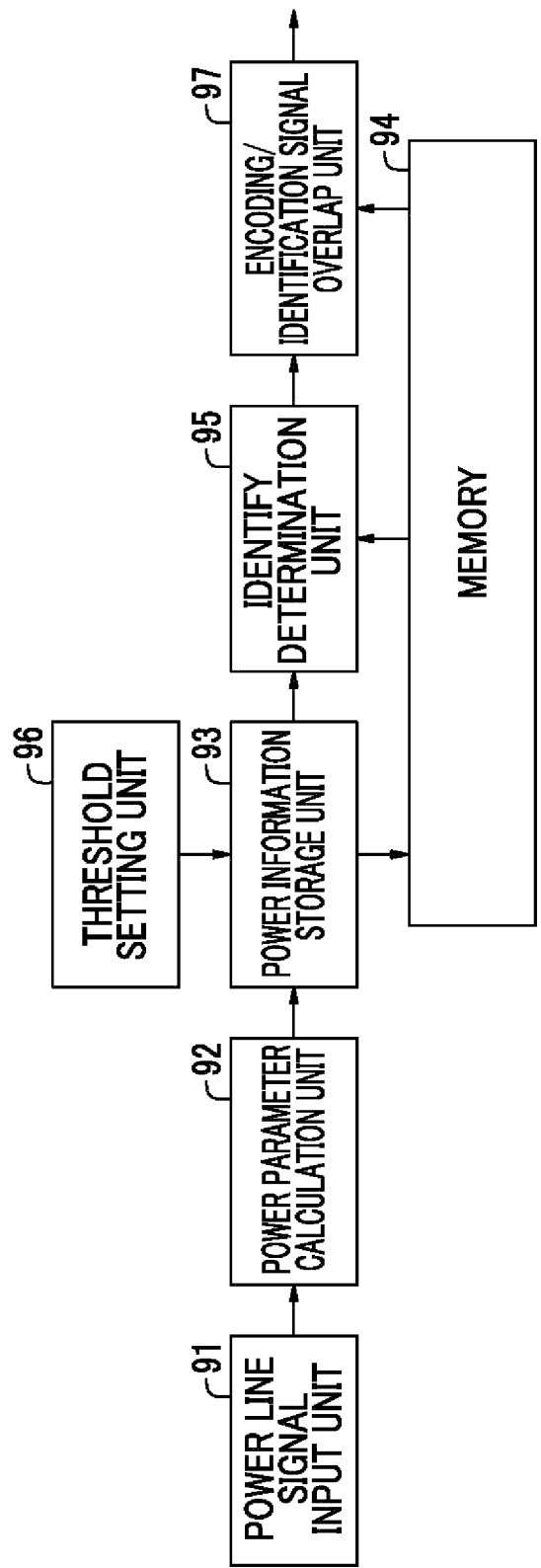
FIG. 13 is a block diagram illustrating an example of a power information encoder.

An example of the encoding unit 81 will be described with reference to FIG. 13. A power line signal is supplied from a power line signal input unit 91 to a power parameter calculation unit 92. The power line signal is the measurement data of the current (which is appropriately referred to as a current waveform) and the measurement data of the voltage (which is appropriately referred to as a voltage waveform) subjected to the phase adjustment and the amplitude normalization, as described above.

The power parameter calculation unit 92 calculates power parameters using the power line signal. The power parameters include, for example, a current value, a voltage value, power, a power factor, and harmonic distortion. The current value and the voltage value are, for example, amplitude values. The power is AC power (apparent power) and is represented by the product of the effective value of the voltage and the effective value of the current. Power which is actually consumed by a load is referred to as effective power. The cosine ($\cos \theta$) of a phase difference $\theta$ between the apparent power and the effective power is referred to as the power factor. The phase difference $\theta$ is ideally zero. The harmonic distortion is the ratio of the sum of all orders of harmonics to a fundamental wave. These power parameters are calculated from the power line signal divided for a predetermined period. The predetermined period is, for example, 1 second.

The voltage and current waveforms and the power parameters calculated by the power parameter calculation unit 92 are stored in a memory 94 by a power information storage unit 93. For example, the previous N power information items are stored in the memory 94. The power information is a general term of the power line signal (the voltage waveform and the current waveform) and the power parameters.

An identity determination unit 95 determines whether the current power information is substantially identical to the previous power information in terms of time. A threshold value setting unit 96 is provided in order to set a threshold value when the identity is determined. The identity determination is not necessarily performed for all of the power information items. For example, the identity determination unit 95 may determine whether voltages, currents, or power factors are identical to each other. The threshold value is set to, for example, each of the voltage, the current, and the power factor. The threshold value may be appropriately changed depending on, for example, the day of the week or time.

When a plurality of temporally previous divided power information items, for example, N temporally previous divided power information items are stored in the memory 94, the current divided power information is compared with the stored N divided power information items and it is determined whether the divided power information items are identical to each other. The current power information which is substantially identical to any one of the N power information items is not transmitted.

When the identity determination unit 95 determines that the power information items are not substantially identical to each other, the current power information is supplied to an encoding/identification signal overlap unit and is encoded. In particular, the power parameter which is numerical data may be transmitted as digital data, without being encoded. Since the voltage and current waveforms of the power line signal are represented by divided waveforms, they are encoded by a waveform encoding method. In addition, the encoding is preferably compression encoding which can compress the amount of data.

When the identity determination unit 95 determines that the power information items are substantially identical to each other, the transmission of the current power information is omitted. That is, instead of the current power information, information (which is appropriately referred to as an identification signal) for specifying substantially identical power information overlaps transmission data. For example, information indicating that the temporal order of the power information which has been determined to be substantially identical to the current power information, a time stamp of the power information, and the power parameter are used as the identification signal. For example, when the power information is stored in the memory 94, it is stored so as to be associated with the identification signal. Therefore, the identification signal is supplied from, for example, the memory 94. Output data from the encoding/identification signal overlap unit 97 is supplied to a communication module, such as a wireless communication module or a wired communication module and is then transmitted.

In general, the power information is normal information and a variation in the power information is small. Therefore, as described above, the percentage of the power information whose transmission can be omitted is relatively high and it is possible to reduce the amount of transmission data. As a result, it is possible to transmit the power information at a low speed. In other words, it is possible to transmit a large amount of power information using communication in the same band.

Figure 14:
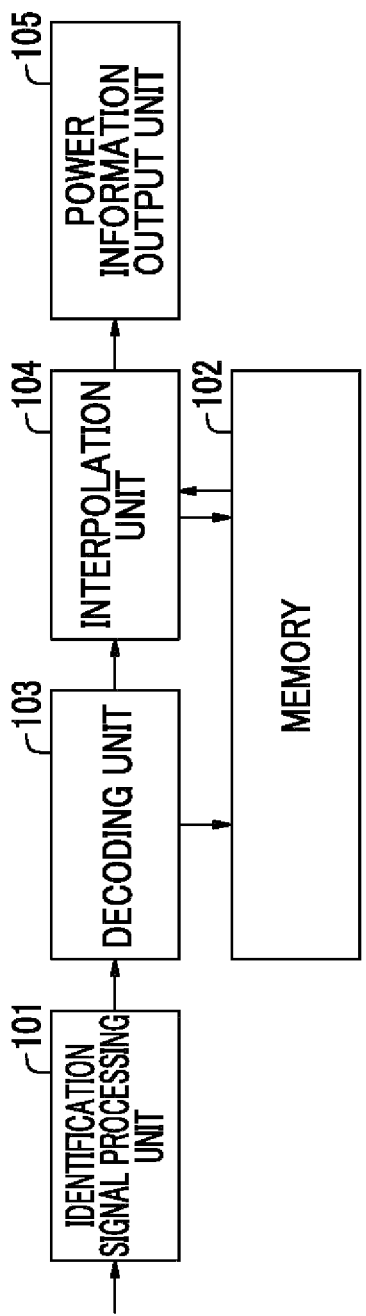
FIG. 14 is a block diagram illustrating a decoder corresponding to an example of the power information encoder.

As shown in FIG. 14, in a receiver, the data received by a communication module (not shown) is supplied to an identification signal processing unit 101. The identification signal processing unit 101 separates the identification signal which overlaps the received data. The encoded data and the identification signal in the power information output from the identification signal processing unit 101 are supplied to a decoding unit 103.

The decoding unit 103 decodes the encoded data of the power line signal (the voltage waveform and the current waveform). The power parameters and the power line signal decoded by the decoding unit 103 are stored in a memory 102. The power information is stored in the memory 102 so as to be associated with the identification signal. Only the identification signal is present in a section in which the transmission of the power information is omitted.

The power information or the identification signal is output from the decoding unit 103 to an interpolation unit 104. The interpolation unit 104 interpolates the power line signal whose transmission is omitted. That is, the identification signal is supplied to the memory 102, the power information corresponding to the identification signal is read from the memory 102, and power information which is thinned out on the basis of the read power information is interpolated. The power information obtained by the interpolation unit 104 is output through a power information output unit 105. The power information is analyzed in the subsequent stage and it is possible to determine, for example, the usage state and power consumption of each electric appliance in a house.

Figure 15:
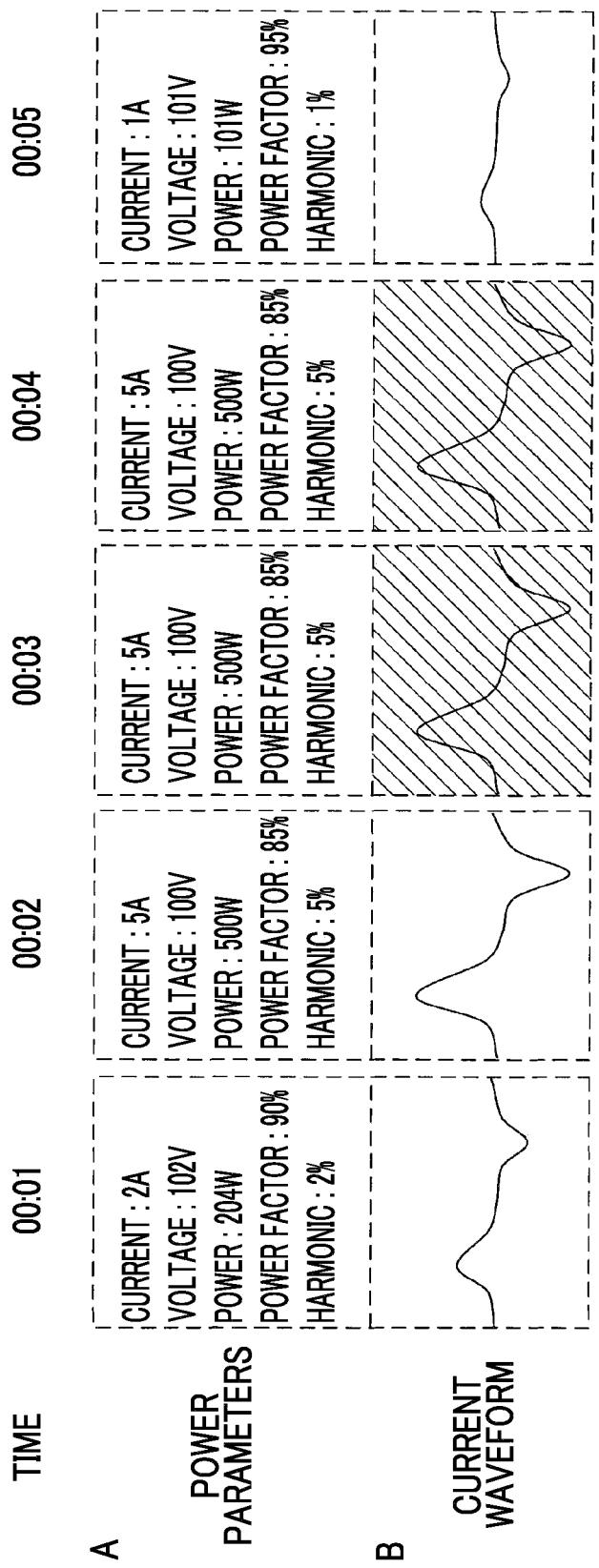
FIGS. 15A and 15B are timing charts used to illustrate an example of the power information encoder.

FIG. 15 shows a detailed example when the power information is transmitted. FIG. 15A shows the power parameters which are divided at an interval of, for example, 1 second and FIG. 15B shows the current waveforms which are divided at an interval of 1 second. In addition to the current waveform, the voltage waveform is transmitted. A power waveform may be transmitted. In the structure of a transmitter shown in FIG. 13, the previous N (N=1, 2, 3, . . . ) power information items are stored in the memory 94.

In the example shown in FIG. 15, it is determined that power information items which are transmitted at a time (00:03) and a time (00:04) are identical to power information (stored in the memory 94) which is transmitted at a time (00:02). Therefore, the transmission of the power line signals and the power parameters at a time (00:03) and a time (00:04) is omitted and an identification signal for specifying the time (00:02) is transmitted.

Figure 16:
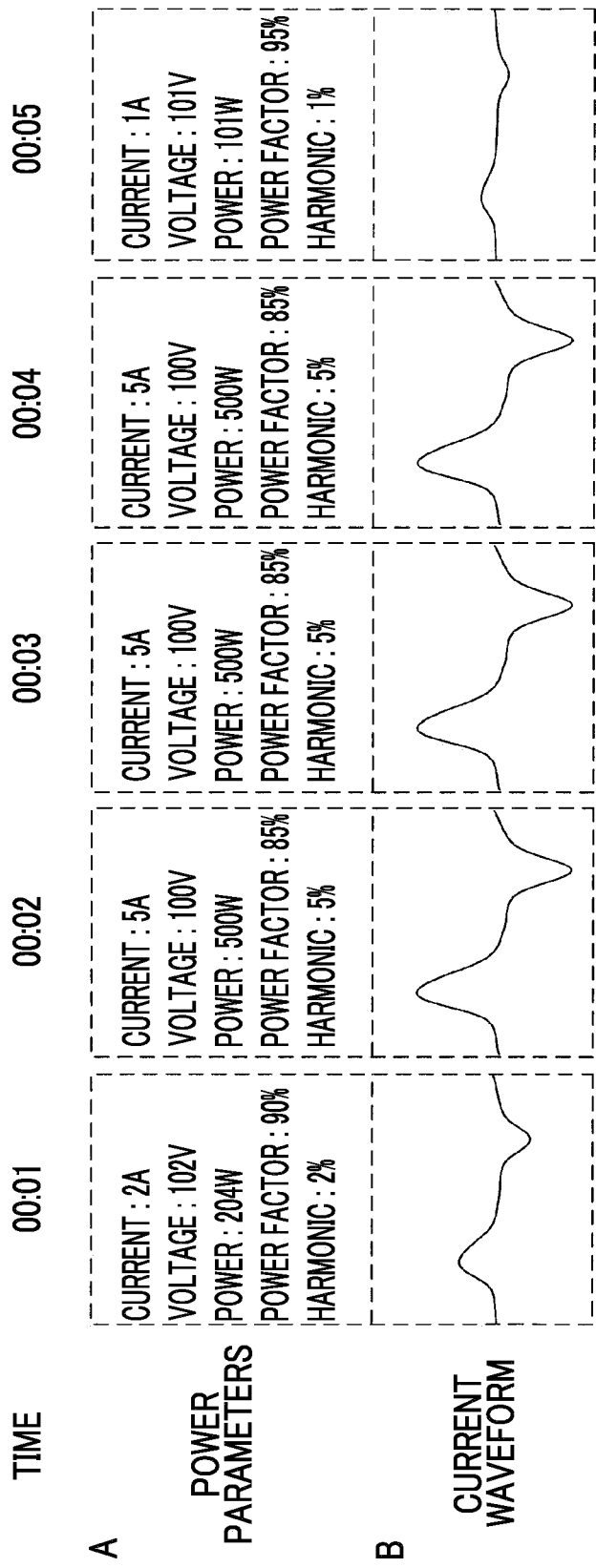
FIGS. 16A and 16B are timing charts used to illustrate a decoder corresponding to an example of the power information encoder.

The transmitted data is processed by the receiver (structure shown in FIG. 14) as shown in FIG. 16. FIG. 16A shows the power parameters which are finally output from the power information output unit 105 in the structure of the receiver shown in FIG. 14. FIG. 16B shows the current waveform which is finally output from the power information output unit 105.

The power information items (the power parameters and the current waveform) which are decoded at a time (00:01) and a time (00:02) are stored in the memory 102. At a time (00:03) and a time (00:04), an identification signal for specifying the power information at the time (00:02) is inserted. The identification signal is given to the memory 102, the power information at the time (00:02) is read from the memory 102, and the read power information is supplied to the interpolation unit 104. The power information items at the time (00:03) and the time (00:04) are interpolated by the power information at the time (00:02) and the power parameters and the current waveforms shown in FIG. 16 are obtained. In addition, the decoded power information in the section in which only the identification signal is inserted is stored in the memory 102.

5. Another Example of Encoding/Decoding

Another example of the method for encoding/decoding the current waveform and the voltage waveform of the power line signal in the above-mentioned power information will be described. Another example is an encoding/decoding method which forms the shape of a waveform at a low bit rate on the basis of the properties and characteristics of the power line signal. This method can transmit data on the basis of a communication standard with a low transmission speed or can store a large amount of current and voltage data.

Figure 17:
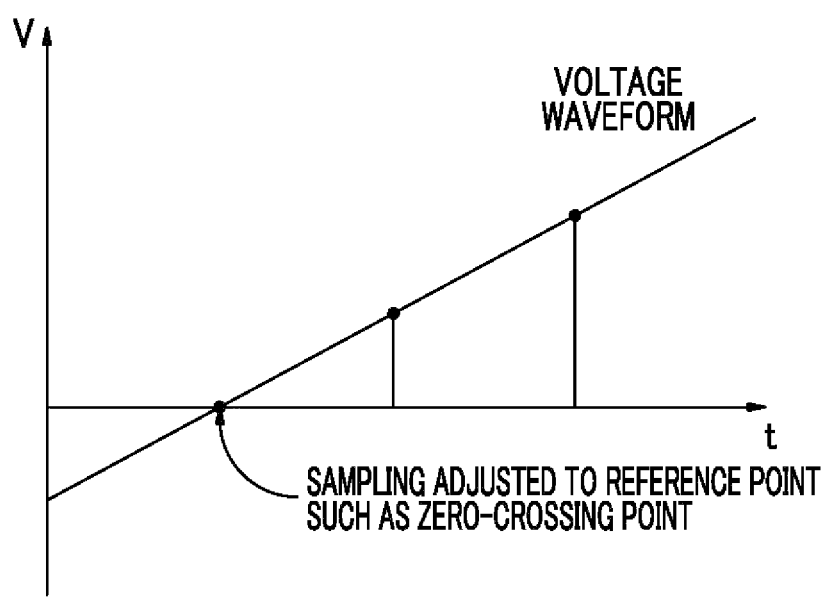
FIG. 17 is a schematic diagram used to illustrate another example of the power information encoder.

In the related art, in waveform encoding, as shown in FIG. 17, when a voltage waveform is sampled, a sampling phase is aligned with a reference point, such as a zero cross of a fundamental wave. Then, a sampling value is quantized and converted into digital data. In order to perform this process, a mechanism which estimates the cycle and phase before analog/digital conversion is needed.

Figure 18:
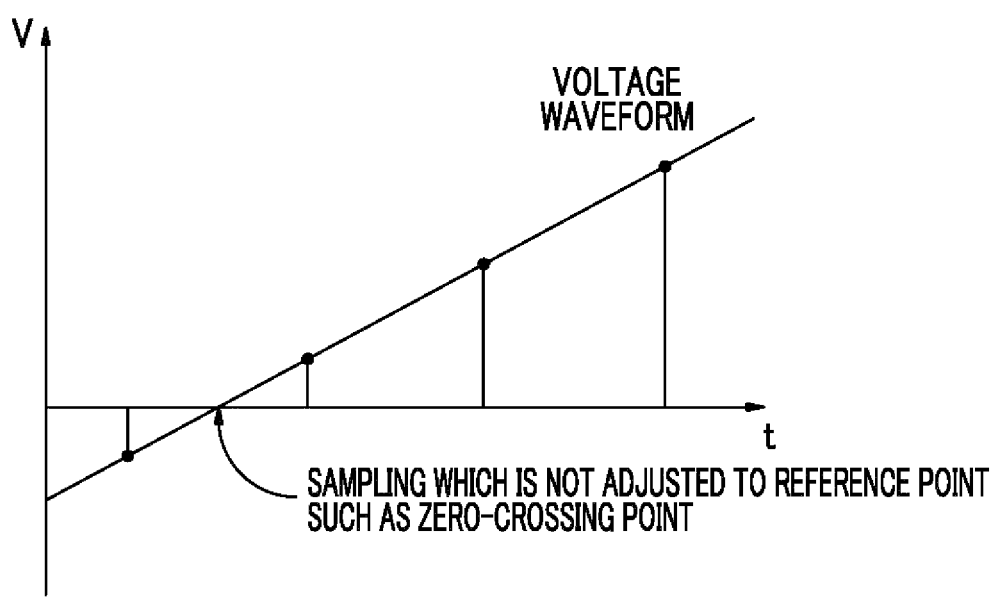
FIG. 18 is a schematic diagram used to illustrate another example of the power information encoder.

On the other hand, when there is no mechanism which estimates the cycle and phase, it is difficult to perform sampling considering the cycle and phase, as shown in FIG. 18. As a result, it is difficult to respond to a change in the cycle and to effectively perform compression when encoding a plurality of frames.

In another example of the encoding according to the present disclosure (hereinafter, appropriately referred to as parametric encoding; decoding corresponding to the encoding is appropriately referred to as parametric decoding), even when there is no mechanism which estimates the cycle and phase, the relative phase of a harmonic component when the phase of a fundamental wave component is zero is used as a parameter and it is possible to reduce the influence of sampling deviation or an error in the fundamental frequency.

The parametric encoding according to the present disclosure encodes information about the amplitudes and phases of the current waveform and the voltage waveform on the basis of the properties that the energy of the current waveform and the voltage waveform is concentrated on the fundamental wave component and a harmonic component thereof. In addition, the ratio of the amplitude of the harmonic component to the amplitude of the fundamental wave component is used as a parameter on the assumption that the amplitude of the harmonic component is equal to or less than that of the fundamental wave component. In this case, it is possible to effectively represent the amplitude of the harmonic component using a limited number of bits and to improve resolution.

Since the parametric encoding according to the present disclosure has the above-mentioned characteristics, it has the following effects.

- Since the phase information of harmonics is described with a connection with the phase of the fundamental wave, it is possible to reduce the influence of sampling deviation or an error in the fundamental wave component. In addition, it is possible to effectively encode the information of a plurality of frames.
- Since the amplitude information of harmonics is described with a connection with the amplitude of the fundamental wave, it is possible to effectively represent the amplitude with a limited number of bits while maintaining resolution.
- Since the parametric encoding is used as a portion of a lossless encoding process, it is possible to perform lossless encoding with a high compression ratio.

Figure 19:
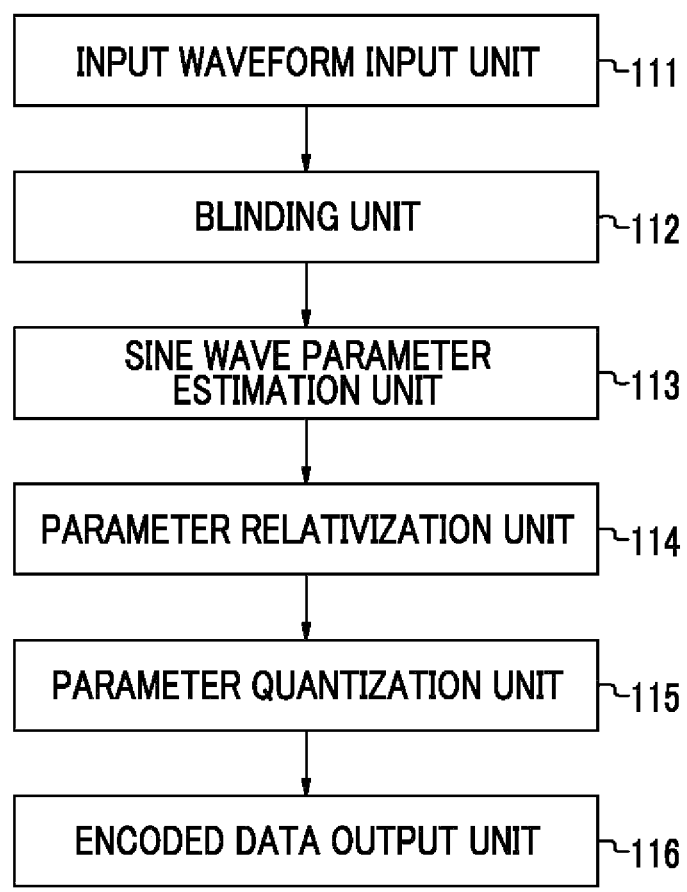
FIG. 19 is a block diagram according to the flow of the process of another example of the power information encoder.

The parametric encoding process according to the present disclosure is schematically configured by a plurality of blocks shown in FIG. 19. The blocks will be sequentially described according to the flow of the process. In the following description, the current waveform, the voltage waveform, and the power waveform are generically referred to as waveforms.

First, a continuous waveform is input through an input waveform input unit 111. Then, a blinding unit 112 divides the input waveform for each predetermined period (in the following description, the predetermined period is appropriately referred to as a frame) and cuts the continuous waveform.

A sine wave parameter estimation unit 113 estimates the amplitudes and phases of the fundamental wave and harmonics with respect to the cut continuous waveform.

Then, a parameter relativization unit 114 converts the amplitude and phase of the harmonics into a parameter representation in which the amplitude and phase of the harmonics are relativized with the relation with the amplitude and phase of the fundamental wave.

Then, a parameter quantization unit 115 quantizes parameters related to the amplitude and phase of each of the fundamental wave and the harmonics with a predetermined number of bits.

Figure 20:
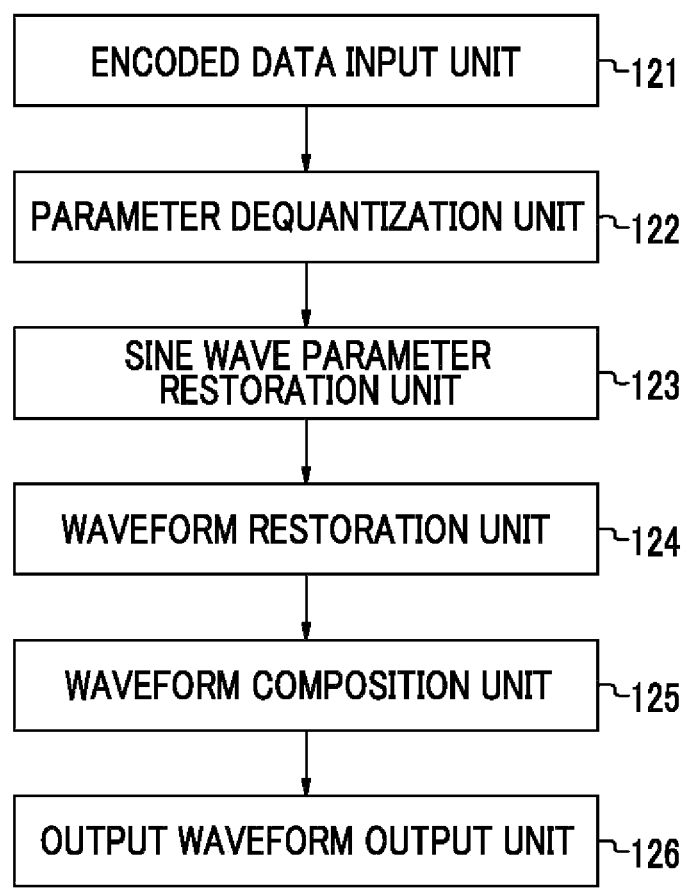
FIG. 20 is a block diagram according to the flow of the process of a decoder corresponding to another example of the power information encoder.

On the other hand, a parametric decoding process corresponding to the parametric encoding according to the present disclosure is schematically configured by a plurality of blocks as shown in FIG. 20. The blocks will be sequentially described according to the flow of the process.

Encoded data is input to a parameter dequantization unit 122 through an encoded data input unit 121 and the parameters are dequantized.

A sine wave parameter restoration unit 123 restores a sine wave parameter from the dequantized parameters.

A waveform restoration unit 124 restores the waveform of a single frame from the sine wave parameter.

A waveform composition unit 125 connects the waveforms of the single frame to form a continuous waveform.

The continuous waveform obtained by the waveform composition unit 125 is extracted through an output waveform output unit 126.

Figure 21:
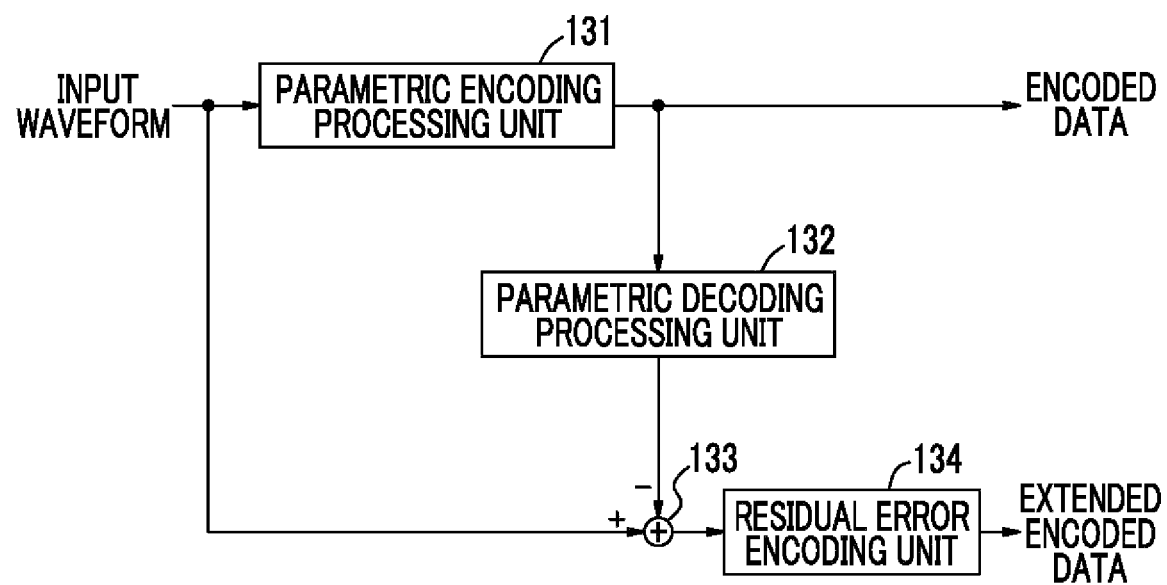
FIG. 21 is a block diagram illustrating the structure of another example of the power information encoder configured for lossless encoding.

FIG. 21 shows the structure of an encoder for performing lossless compression. An input waveform is supplied to a parametric encoding processing unit 131. The parametric encoding processing unit 131 performs the parametric encoding which has been described with reference to FIG. 19. The encoded data output from the parametric encoding processing unit 131 is supplied to a parametric decoding processing unit 132. The parametric decoding processing unit 132 performs the parametric decoding which has been described with reference to FIG. 20.

The input waveform and the decoded waveform generated by the parametric decoding processing unit 132 are supplied to a subtraction unit 133. The difference (referred to as a residual error) between the input waveform and the decoded waveform is obtained from the subtraction unit 133. The residual error is an error component which is generated during the encoding/decoding process. The residual error from the subtraction unit 133 is supplied to a residual error encoding unit 134 and an output (referred to as extended encoded data) from the residual error encoding unit 134 is obtained.

The residual error encoding unit 134 performs entropy coding, such as Huffman encoding or arithmetic coding for effectively compressing the residual error. Alternatively, the residual error encoding unit 134 may use, for example, linear predictive coding or difference encoding or it may use a combination of these encoding means. The encoded data and the extended encoded data are transmitted.

Figure 22:
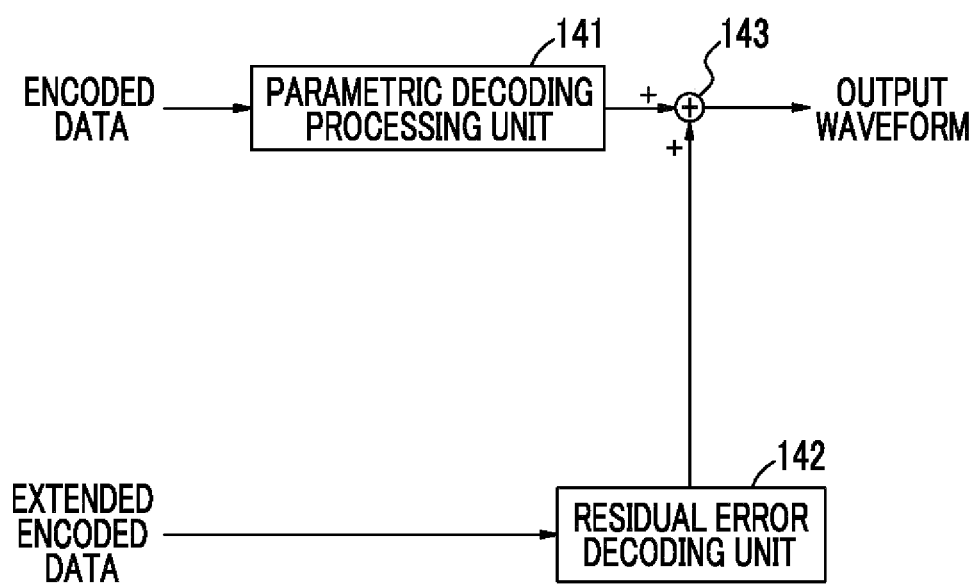
FIG. 22 is a block diagram illustrating a decoder when another example of the power information encoder is configured for lossless encoding.

A decoder has the structure shown in FIG. 22. The received encoded data is supplied to a parametric decoding processing unit 141. The parametric decoding processing unit 141 performs the parametric decoding which has been described with reference to FIG. 20. The decoded output of the parametric decoding processing unit 141 is supplied to an addition unit 143.

The received extended encoded data is supplied to a residual error decoding unit 142 and the residual error is decoded. For example, variable-length-encoded data is decoded. The residual error obtained by the residual error decoding unit 142 is supplied to the addition unit 143. The addition unit 143 adds the decoded output of the parametric decoding processing unit 141 and the residual error and lossless decoding can be performed. The decoded output waveform is extracted from the addition unit 143. Lossless encoding is performed by the above-mentioned encoding and decoding processes.

Figure 23:
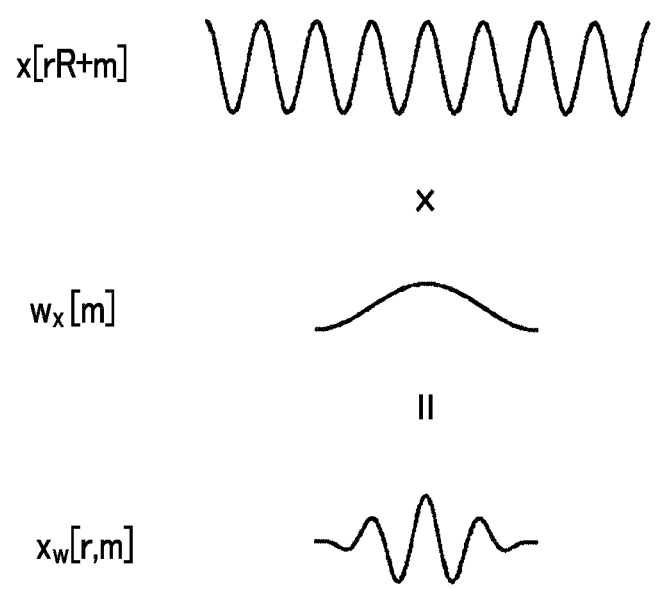
FIG. 23 is a waveform diagram illustrating the process of a blinding unit in the process of another example of the power information encoder.

Each unit of the parametric encoding process which has been described with reference to FIG. 19 will be described in detail. First, the process of the blinding unit 112 will be described. The blinding unit 112 performs a process of applying a window function to input waveform data. The window function has a value of 0 out of a given finite section (one frame period). A blinding process is represented by the following Expression (1) and can also be represented by the waveform diagram shown in FIG. 23. The window function shown in FIG. 23 is an illustrative example.

$$x_w[r,m]=w_x[m]x[rR+m](-L/2\le m\le L/2-1) \quad \text{[Expression 1]}$$

x[n]: an input voltage waveform or an input current waveform
$w_x[n]$: a window function
$x_w[r,m]$: an r-th blinded frame of input signal
R: a period for which blinding is performed
r: the number of a frame which is cut by blinding
L: the length of one frame When the input waveform is a cut waveform (burst waveform), the blinding process may be omitted. In this case, Expression (2) is established.

$$x_w[r,m]=x[rR+m] \quad \text{[Expression 2]}$$

The sine wave parameter estimation unit 113 estimates the amplitudes and phases of the fundamental wave and the harmonics using discrete Fourier transform (or fast Fourier transform). The sine wave parameter estimation process is represented by the following Expression (3). In Japan, the frequency (fundamental frequency) of the fundamental wave is fixed. For example, the fundamental frequency is fixed to 50 Hz in eastern Japan and is fixed to 60 Hz in western Japan. When the fundamental frequency is 50 Hz, the frequency of a second harmonic is 100 Hz, the frequency of a third harmonic is 150 Hz, the frequency of a fourth harmonic is 200 Hz, .... Originally, power transmitted from the electric power company includes few harmonics. However, harmonics are generated in, for example, a house and a factory and the generated harmonics flow to the power lines. In practice, power is a waveform including harmonics.

$$X_k[r] = \sum_{m=L/2}^{L/2-1} x_w[r,m] e^{-j(2\pi F_j iF_s)km} \quad \text{[Expression 3]}$$

$$X_r^{amp}[r] = |X_k[r]|$$

$$X_k^{pha}[r] = \arg X_k[r]$$

$X_k[r]$: a k-th complex narrow band component of an r-th frame
$X_k^{amp}[r]$: the amplitude of the k-th complex narrow band component of the r-th frame
$X_k^{pha}[r]$: the phase of the k-th complex narrow band component of the r-th frame
k: a bin number of DFT (1 is a fundamental wave component, 0 is a DC component, and the others are harmonic components)
$F_f$: a fundamental frequency (50 Hz or 60 Hz)
$F_s$: a sampling frequency For example, the fundamental wave of a given frame has an amplitude of 10 and a phase of $(1/3)\pi$ and the third harmonic has an amplitude of 3 and a phase of $(1/6)\pi$. The description of a higher-order harmonic will be omitted for simplicity of explanation. The phase of the fundamental wave is a reference phase of the fundamental wave, for example, a phase for a zero crossing point.

In the stage of the sine wave parameter estimation process, harmonic components in a high frequency band in which energy tends to be low or harmonic components which are an even multiple of the fundamental wave may not be calculated to reduce a calculation load in the subsequent stage and to reduce the bit rate of the encoded data. For the waveform of the power line signal, a positive waveform and a negative waveform are symmetric. Therefore, the energy of the harmonic components which are an even multiple of the fundamental wave tends to be low.

The parameter relativization unit 114 describes (that is, relativizes) information about the amplitude and phase of the harmonics with the relation with the amplitude and phase of the fundamental wave in the estimated sine wave parameter. In the amplitude relativization process, as represented by the following Expression (4), the amplitude of the harmonics is converted into the ratio of the amplitude of the harmonics to the amplitude of the fundamental wave. The amplitude of the fundamental wave is not relativized. In the above-mentioned numerical example, the relativized amplitude of the third harmonic is (3/10).

$$X'^{amp}_k[r]=X^{amp}_k[r]/X^{amp}_1[r] \quad (k\ne 1)$$

$$X'^{amp}_1[r]=X^{amp}_1[r] \quad \text{[Expression 4]}$$

Here, as represented by the following Expression (5), clipping may be performed on the assumption that the amplitude of the harmonics is not greater than that of the fundamental wave.

$$X'^{amp}_k[r]1 \to X'^{amp}_k[r]=1 \quad \text{[Expression 5]}$$

The relativization process may not be performed on a DC component, as represented by the following Expression (6).

$$X'^{amp}_0[r]=X^{amp}_0[r] \quad \text{[Expression 6]}$$

For the phase of the harmonics, as represented by the following Expression (7), the phase of the harmonics is converted into a phase when the phase of the fundamental wave is zero. The phase of the fundamental wave is maintained. In addition, since the phase of the DC component is constantly zero, it does not need to be encoded. In the above-mentioned numerical example, the relativized phase of the third harmonic is $((1/3)\pi-3\cdot(1/6)\pi=-(1/6)\pi)$. Since the harmonic is the third harmonic, 3 is multiplied.

$$X'^{pha}_k[r]=X^{pha}_k[r]-kX^{pha}_1[r] \quad (k\ne 0,1)$$

$$X'^{pha}_1[r]=X^{pha}_1[r] \quad \text{[Expression 7]}$$

Here, an integer multiple of $2\pi$ is added (subtracted) by the following Expression (8) such that the above-mentioned value falls in the range of $-\pi$ to $\pi$.

$$X'^{pha}_k[r]<-\pi \text{ or } \pi\le X'^{pha}_k[r] \to X'^{pha}_k[r]=X'^{pha}_k[r]+2\pi l$$
(l is an integer) [Expression 8]

When a plurality of frames are encoded, the parameters of a reference frame may be stored and the difference between the stored parameters and the parameters to be encoded may be calculated and then output. At that time, data indicating whether the parameters are the parameters of the reference frame or the parameters of the frames which are not the reference frame is also output. In addition, the frames which are not the reference frame need to be connected to the reference frame.

The parameter quantization unit 115 quantizes each of the relativized parameters (a set of the phase and the amplitude) with a predetermined number of bits. The quantization may be linear quantization or non-linear quantization. The number of bits may be adaptively allocated. For example, a different value may be defined for each parameter or different values may be defined for the encoding of the current waveform and the encoding of the voltage waveform. For example, since a harmonic component of the current waveform is stronger than that of the voltage waveform, the number of bits for the current waveform can be greater than the number of bits for the voltage waveform.

Vector quantization may be performed on a plurality of parameters. When a plurality of frames are encoded, the reference frame and the other frames which are represented by the difference are differently quantized. As such, the quantized parameters are final encoded data.

Each unit in the parametric decoding process which has been described with reference to FIG. 20 will be described in detail. First, the process of the parameter dequantization unit 122 will be described. The parameter dequantization unit 122 dequantizes the quantized parameters in the encoding process. When a plurality of frames are encoded, difference information which is dequantized to the parameters of the connected reference frame is added to the frames other than the reference frame.

The sine wave parameter restoration unit 123 restores the sine wave parameter from the dequantized parameters as represented by the following Expression (9).

$$Y_k^{amp}[r] = Y'^{amp}_k[r] Y_l^{amp}[r] \quad (k \neq 1)$$

$$Y_l^{amp}[r] = Y'^{amp}_l[r]$$

$$Y_k^{pha}[r] = Y'^{pha}_k[r] + k Y_l^{pha}[r] \quad (k \neq 0, 1)$$

$$Y_l^{pha}[r] = Y'^{pha}_l[r]$$

$$Y_0^{pha}[r] = 0 \qquad \text{[Expression 9]}$$

$Y'^{amp}_k[r]$: a parameter related to an amplitude which is obtained by dequantization $Y_k^{amp}[r]$: the amplitude of a restored complex narrow band component $Y'^{pha}_k[r]$: a parameter related to a phase which is obtained by dequantization $Y_k^{pha}[r]$: the phase of the restored complex narrow band component When the parameter relativization unit 114 does not relativize the DC component, the relationship represented by the following Expression (10) is established.

$$Y_0^{amp}[r] = Y'^{amp}_0[r] \qquad \text{[Expression 10]}$$

The waveform restoration unit 124 restores the waveform of a single frame using the restored sine wave parameter, as represented by the following Expression (11).

$$Y_k[r] = Y_k^{amp}[r] e^{-j Y_k^{pha}[r]} \qquad \text{[Expression 11]}$$

$$y[r, m] = \text{real}\left( \sum_k Y_k[r] e^{j(2\pi F_j / F_s) k m} \right) \quad (-L/2 \leq m \leq L/2 - 1)$$

$Y_k[r]$: a restored complex narrow band component $y[r,m]$: the restored waveform of an r-th frame The waveform composition unit 125 performs blinding on the waveform of the restored single frame to smoothly connect the frame and the previous frame and outputs a continuous waveform, as represented by the following Expression (12) (see FIG. 24).

$$y_w[r, m] = w_y[m] y[r, m] \qquad \text{[Expression 12]}$$

$$z[n] = C \sum_{r \in \{-L/2 \leq n - rR \leq L/2 - 1\}} y_w[r, n - rR]$$

$w_y[m]$: a window function $y_w[r,m]$: the restored waveform of a blinded r-th frame $z[n]$: an output current waveform or an output voltage current C: a constant for adjusting a scale When the continuous waveform does not need to be output, the restored waveform is used as an output waveform, as represented by the following Expression (13).

$$z[n] = C y[r, n - rR] \quad (-L/2 \leq n - rR \leq l/2 - 1) \qquad \text{[Expression 13]}$$

In addition, the present disclosure can have the following structure.

(1)

A sensor includes a current sensor that detects a current of a power line as a change in a magnetic field and a voltage sensor that detects a voltage of the power line using capacitive coupling. The current sensor and the voltage sensor are integrally formed.

(2)

The sensor according to (1) generates its operating power from a measurement signal of the current sensor.

(3)

The sensor according to (2) further includes an electric storage element that stores the measurement signal of the current sensor and uses an output from the electric storage element as the operating power.

(4)

In the sensor according to any one of (1) to (3), the power line passes through a hole of a ring core and the current sensor measures a current which is induced to a secondary winding that is wound on the ring core.

(5)

The sensor according to (4) further includes a holding portion that holds the power line in the hole of the ring core on both sides to dispose the power line at a substantially central position of the hole.

(6)

In the sensor according to (4), the voltage sensor includes an electrode which is provided on an inner circumferential surface of the ring core and measures the voltage of the power line using the capacitive coupling.

(7)

In the sensor according to any one of (4) to (6), at least first and second electrodes face each other, with the hole interposed therebetween, and measurement signals from the first and second electrodes are added and output.

(8)

In the sensor according to (7), the first and second electrodes are arranged in parallel to a direction in which the power line extends.

(9)

In the sensor according to (4), the current sensor and the voltage sensor are provided in different ring cores.

(10)

In the sensor according to any one of (1) to (9), the measurement signal of the current sensor and the measurement signal of the voltage sensor are output as a 2-channel audio signal.

(11)

The sensor according to any one of (1) to (10) is attached to at least one of the inside of a power meter, a power line on the input side of a distribution panel, and the inside of the distribution panel.

(12)

Provided is a sensor signal processor that receives a measurement signal from a sensor in which a current sensor detecting a current of a power line as a change in a magnetic field and a voltage sensor detecting a voltage of the power line using capacitive coupling are integrally formed. The sensor signal processor includes a phase correction unit that corrects a phase of the measurement signal of the voltage sensor in correspondence with a frequency of the voltage such that a phase of the measurement signal is substantially identical to a phase of the voltage of the power line.

(13)

The sensor signal processor according to (12) further includes an amplitude normalization unit that normalizes an amplitude of the measurement signal.

(14)

The sensor signal processor according to (12) or (13) treats the measurement signals from the current sensor and the voltage sensor as audio data or in a format similar to the audio data.

(15)

The sensor signal processor according to any one of (12) to (15) determines the power consumption and state of an electric appliance connected to the power line from the measurement signals from the current sensor and the voltage sensor.

(16)

Provided is a power line signal encoder that receives a power line signal, divides the power line signal into preset sections, determines whether the divided power line signals are identical to each other, omits the transmission of a first divided power line signal when the first divided power line signal is substantially identical to a second divided power line signal which precedes the first divided power line signal in terms of time, transmits the first divided power line signal when the first divided power line signal is not substantially identical to the second divided power line signal, and encodes the first divided power line signal to be transmitted.

(17)

The power line signal encoder according to (16) stores a plurality of the second divided power line signals and determines whether the first divided power line signal is identical to each of the stored plurality of second divided power line signals.

(18)

The power line signal encoder according to (16) or (17) calculates power parameters including two or more of power, a current, a voltage, a power factor, and harmonics from the power line signal and performs the determination using the power parameters.

(19)

The power line signal encoder according to any one of (16) to (18) transmits information specifying the second divided power line signal, instead of the first divided power line signal, when the first divided power line signal is substantially identical to the second divided power line signal.

(20)

In the power line signal encoder according to any one of (16) to (19), the power line signal is a current waveform and/or a voltage waveform that is input from a sensor in which a current sensor detecting a current of a power line as a change in a magnetic field and a voltage sensor detecting a voltage of the power line using capacitive coupling are integrally formed.

(21)

The power line signal encoder according to any one of (16) to (20) transmits information about a difference between the first divided power line signal to be transmitted and a decoded value of the first divided power line signal to perform encoding.

(22)

A power line signal encoder includes an estimation unit that estimates a first amplitude and a first phase of a fundamental wave with a current waveform and/or a voltage waveform in a predetermined section and a second amplitude and a second phase of a harmonic, a relativization unit that relativizes the second amplitude with the first amplitude and relativizes the second phase with the first phase, and a quantization unit that quantizes the first amplitude and the first phase and the relativized second amplitude and second phase.

(23)

In the power line encoder according to (22), the estimation unit estimates an amplitude of a DC component of the current waveform and/or the voltage waveform, and the quantization unit quantizes the amplitude of the DC component.

(24)

In the power line encoder according to (22) or (23), the estimation unit does not calculate a harmonic component in a high frequency band with relatively low energy.

(25)

In the power line encoder according to any one of (22) to (24), the estimation unit does not calculate a harmonic component having a frequency with relatively low energy which is an even multiple of the frequency of the fundamental wave.

(26)

In the power line encoder according to any one of (22) to (25), the relativization unit relativizes the second amplitude on the basis of a ratio of the second amplitude and the first amplitude. The relativization unit converts the second phase into a phase when the first phase is zero to relativize the second phase.

(27)

In the power line encoder according to any one of (22) to (26), when the relativized second amplitude is greater than 1, the relativization unit sets the value of relativized second amplitude to 1.

(28)

In the power line encoder according to any one of (22) to (27), the quantization unit performs the quantization using a quantization bit number which is adaptively allocated to each of the first amplitude and the first phase, and the relativized second amplitude and second phase.

(29)

In the power line encoder according to any one of (22) to (28), when a plurality of predetermined sections are encoded, the first amplitude and the first phase, and the second amplitude and the second phase are a difference between a value in the predetermined section as a reference and a value in the predetermined section to be encoded.

(30)

Provided is a power line encoder that decodes data encoded by the power line encoder according to (22), calculates a difference between a true value and a decoded value, performs difference encoding on the difference, and transmits the encoded data and the difference-encoded data.

6. Modification Examples

The embodiments of the present disclosure have been described in detail above. However, the present disclosure is not limited to each of the above-described embodiments, but various modifications and changes can be made without departing from the technical spirit of the present disclosure. For example, an example and another example of the encoding may be combined with each other to achieve encoding with a high compression ratio. In addition, the encoding according to the present disclosure can be applied to a process of encoding waveforms from sensors other than the above-mentioned sensors.

For example, the structures, methods, processes, shapes, materials, and values described in the embodiments are illustrative examples and different structures, methods, processes, shapes, materials, and values may be used if necessary.

REFERENCE SIGNS LIST

3: DISTRIBUTION PANEL
11a, 11b: SENSOR
12, 13: SENSOR SIGNAL PROCESSING UNIT
21: RING CORE
23, 28: POWER LINE
25: MOVABLE PORTION
26: FIXED PORTION
27: CLAMPING HOLE
29a, 29b: AUDIO CABLE
31a, 31b: ELECTRODE
41a, 41b, 43a, 43b, 45a, 45b: ELECTRODE
42a, 42b, 44a, 44b, 46a, 46b: INSULATING LAYER
51a, 51b: PRESSING MEMBER
65: DSP
72: CPU
81: ENCODING UNIT
92: POWER PARAMETER CALCULATION UNIT
94: MEMORY
95: IDENTITY DETERMINATION UNIT
97: ENCODING/IDENTIFICATION SIGNAL OVERLAP UNIT
102: MEMORY
104: INTERPOLATION UNIT
112: BLINDING UNIT
113: SINE WAVE PARAMETER ESTIMATION UNIT
114: PARAMETER RELATIVIZATION UNIT
115: PARAMETER QUANTIZATION UNIT
131: PARAMETRIC ENCODING PROCESSING UNIT
132: PARAMETRIC DECODING PROCESSING UNIT
133: SUBTRACTION UNIT
134: RESIDUAL ERROR ENCODING UNIT

The invention claimed is:

1. A power line signal encoder that is configured to:
receive a power line signal,
divide the power line signal into preset sections of time,
determine whether the divided power line signal sections are substantially identical to each other using a threshold value,
omit the transmission of a first divided power line signal section when the first divided power line signal section is substantially identical to a second divided power line signal section which precedes the first divided power line signal section in terms of time,
transmit the first divided power line signal section when the first divided power line signal section is not substantially identical to the second divided power line signal section, and
encode the first divided power line signal section to be transmitted,
wherein a plurality of the divided power line signal sections are stored, and it is determined whether the first divided power line signal section is identical to each of the stored plurality of divided power line signal sections.

2. The power line signal encoder according to claim 1, wherein power parameters including two or more of power, a current, a voltage, a power factor, and harmonics are calculated from the power line signal, and
the determination is performed using the power parameters.

3. The power line signal encoder according to claim 1, wherein, when the first divided power line signal section is substantially identical to the second divided power line signal section, information specifying the second divided power line signal section is transmitted instead of the first divided power line signal section.

4. The power line signal encoder according to claim 1, wherein the power line signal is a current waveform and/or a voltage waveform that is input from a sensor in which a current sensor detecting a current of a power line as a change in a magnetic field and a voltage sensor detecting a voltage of the power line using capacitive coupling are integrally formed.

5. The power line signal encoder according to claim 1, wherein information about a difference, which is a residual error, between (i) the first divided power line signal section to be transmitted as encoded data and (ii) a decoded waveform of the encoded data of the first divided power line signal section to be transmitted, is used to perform encoding.

* * * * *